United States Patent [19]

Kusunoki et al.

[11] Patent Number: 5,512,766
[45] Date of Patent: Apr. 30, 1996

[54] SEMICONDUCTOR INTEGRATED CIRCUIT DEVICE

[75] Inventors: Mitsugu Kusunoki; Shuuichi Miyaoka, both of Ohme; Michiaki Nakayama, Tokyo; Kouji Kobayashi, Hadano; Masato Ikeda, Takasaki; Takashi Ogata, Ohme, all of Japan

[73] Assignees: Hitachi, Ltd.; Hitachi Microcomputer System Ltd., both of Tokyo, Japan

[21] Appl. No.: 137,958

[22] Filed: Oct. 15, 1993

Related U.S. Application Data

[62] Division of Ser. No. 764,938, Sep. 24, 1991, abandoned.

[30] Foreign Application Priority Data

Oct. 10, 1990 [JP] Japan .................................. 2-271357

[51] Int. Cl.$^6$ ............................. H01L 27/02; H01L 27/10
[52] U.S. Cl. ........................ 257/296; 257/906; 257/298; 257/300; 257/390; 257/202; 257/205; 257/206; 257/210
[58] Field of Search ........................... 365/189.010, 190; 257/296, 906, 298, 300, 390, 202, 205, 206, 210

[56] References Cited

U.S. PATENT DOCUMENTS

| | | | |
|---|---|---|---|
| 4,959,704 | 9/1990 | Isomura et al. | 357/41 |
| 4,980,733 | 12/1990 | Sugiura | 257/296 |
| 4,984,050 | 1/1991 | Kobayashi | 257/906 |

FOREIGN PATENT DOCUMENTS

| | | |
|---|---|---|
| 63-120438 | 5/1988 | Japan . |
| 4-151868 | 5/1992 | Japan . |

*Primary Examiner*—Viet Q. Nguyen
*Attorney, Agent, or Firm*—Fay, Sharpe, Beall, Fagan, Minnich & McKee

[57] ABSTRACT

A logic block of a memory (LSI) with logic functions includes RAM macrocells (RAMO–RAM7) and a centrally located gate array (GAO–GA5). Clock pulse shaping circuits (CSPO, CSP1) and input/output portion (I/O) surround the logic block. The logic block power supply includes a smoothing capacitor (CC) that is substantially the same size as a cell (GC) of the gate array. Each RAM macrocell has memory mats (MATOO–MAT21), word lines (WO–W127), data lines (DO–D7), and peripheral circuits (MPCOO–MPC21), which includes an address decoder and a sense amp (SAO). An input unit cell (ICO) receives ECL level signals and outputs ECL level signals (FIG. 5) and MOS level signals (FIG. 6). The input unit cells and analogous output unit cells (OCO) are selectively used singly or in parallel to accommodate signals of different form and driving capability. A wiring line replacement region (LRP) connects memory macrocell wiring lines with logic block wiring lines. A sequence control circuit cell or aligner (ALNO, ALN1) contiguous to the RAM macrocells transmits output signals to the logic block on the wiring lines. A clock signal distribution circuit (CDA) is arranged centrally of the RAM macrocells for distributing ECL level clock signals. The clock signal distribution circuit includes clock switch amplifier circuits (CSAO–CSA9) including bipolar transistors and MOSFETs (FIG. 23).

47 Claims, 20 Drawing Sheets

SEMICONDUCTOR INTEGRATED CIRCUIT DEVICE

This is a division of U.S. application Ser. No. 07/764,938, filed Sep. 24, 1991, now abandoned.

BACKGROUND OF THE INVENTION

This invention relates to semiconductor integrated circuit devices. The invention finds particular application in memories with logic functions for buffer storage and memory devices of a computer and will be described in conjunction therewith.

Heretofore, digital processors of computers and the like have included buffer storage that has memories with logic functions. The memories, typically random access memories (RAMs), have included a plurality of macrocells and a gate array. One such memory is disclosed in U.S. Pat. No. 4,959,704, issued Sep. 25, 1990 to Isomura, et al.

Because the prior art memories were constructed of bipolar transistors, it was difficult to achieve higher integration density and larger storage capacities. Moreover, the prior art memories were relatively power consumptive.

In order to cope with these difficulties, the inventors constructed a hybrid bipolar-CMOS type RAM. This hybrid RAM operated at a comparatively high speed, was capable of higher integration density, and consumed less power. However, even the hybrid memory had several drawbacks.

First, in the hybrid memory, the logic circuits, such as sequence control ,circuits, for selectively transmitting the output signals of the RAM macrocells were constructed by combining a plurality of unit gate array cells in a gate array portion. As the storage capacity of the hybrid memory was enlarged, the number of bits of storage input to and output from the RAM macrocells increased. To accommodate the increased data input and output, the number of spanning wiring lines between each RAM macrocell and the gate array portion increased and the transmission paths of the storage data items were lengthened. As a result, the layout design of the memory with logic functions became difficult to enlarge, and the operating speed of the memory was limited.

Second, the plurality of unit gate array cells of the gate array portion were connected with a supply voltage and ground through a supply voltage and ground feed wiring lines. As the scale of the hybrid memory was enlarged and the number of cells of the gate array portion increased, the fluctuation of the supply voltage within the gate array portion increased, rendering the operation of this portion unstable.

Third, the hybrid memory had some signals transmitted at ECL levels, (e.g. clock signals) and some signals transmitted at MOS levels (e.g. address signals). As the hybrid memory was microfabricated and the scale was enlarged, the mutual interference between these signals and the skew between bits increased, rendering its operation unstable.

Fourth, in the hybrid memory, signal wiring lines for the RAM macrocells were chiefly laid out by hand labor. The signal wiring lines for the gate array portion were chiefly laid out by automatic computer controlled machinery as the scale of the memory was enlarged, the number of the spanning wiring lines between the RAM macrocells and the gate array portion increased. It became difficult to lay out these spanning wiring lines in part manually and in part by automation.

Fifth, differential transistors were used in current switch circuits of high sensitivity. These current switch circuits and a bipolar-CMOS hybrid circuit were fed with the supply voltage through a common supply voltage feed point. A substrate potential pulling-up power source line, included in the bipolar-CMOS hybrid circuit, was coupled to that supply voltage feed wiring line of the current switch circuit side on which the supply voltage fluctuates comparatively little. Even when supply voltage feed wiring lines were laid separately for the current switch circuits and the bipolar-CMOS hybrid circuit, the source line was laid near N-channel MOSFETs. The operation of the memory with logic functions became unstable. The N-channel MOSFETs were reverse-biased to prevent latch-up.

The present invention solves the aforementioned several problems by stabilizing operation, providing an efficient layout design, and reducing the chip area.

SUMMARY OF THE INVENTION

In accordance with one aspect of the present invention, a semiconductor integrated circuit device is provided. A logic circuit block includes a plurality of logic gates which are programmable by computer signal wiring. A plurality of memory macrocells are dispersively arranged on a semiconductor substrate. Each memory macrocell includes a memory mat and a peripheral circuit. The memory mat has a plurality of word lines, complementary data line pairs, and memory cells. The peripheral circuit has an address decoder and a sense amp circuit.

A logic circuit cell unit which is arranged contiguous to said memory macrocells, includes a predetermined logic circuit to transmit output signals from said memory macrocells to said logic circuit block.

In accordance with another aspect of the present invention, a semiconductor integrated circuit device is provided. A plurality of logic blocks are formed on a semiconductor substrate. Each logic block includes a plurality of unit logic gate array cells which are programmable by signals received on a signal wiring and powered by a supply voltage received on a power supply line. Each logic block also includes a plurality of unit capacitor cells, each of which has substantially the same area as one of the unit gate array cell. The unit capacitor cells are connected to the power supply line contiguous to each logic block. A plurality of memory macrocells are dispersively arranged on the semiconductor substrate. Each memory macrocell includes a memory mat and a peripheral circuit.

In accordance with another aspect of the present invention, a semiconductor integrated circuit device is provided. An input circuit cell unit includes a plurality of input circuit cells. Each input circuit cell includes an ECL-MOS level conversion circuit which converts an ECL level input signal into a MOS level internal signal. A logic circuit block and a plurality of macrocells, which operate at MOS levels are mounted on a common substrate. The logic circuit block includes a plurality of logic gates which are programmable by signals received on signal wiring. The memory macrocells each include a memory mat and a peripheral circuit. The logic block and the macrocells are connected with the input circuit cell unit to receive the internal MOS level signals therefrom. An output circuit unit includes a plurality of output circuit cells, which are each connected with the logic circuit block and the macrocells to receive the internal MOS level signals therefrom. The output circuit unit includes a MOS-ECL level conversion circuit which converts the internal ECL level signals into MOS output signals.

In accordance with another aspect of the present invention, a semiconductor integrated circuit device is provided. A logic circuit block includes a plurality of logic gates which are programmable by signals received on a signal wiring. A plurality of memory macrocells each include a memory mat and a peripheral circuit. A first signal line transmits a first level signal from a first input circuit to the logic circuit block and the memory macrocells. A second signal line transmits a second level signal from a second input circuit to the logic circuit block and the memory macrocells. A shielded wiring line is disposed between said first and second signal lines.

In accordance with another aspect of the invention, a semiconductor integrated circuit device is provided. A logic circuit block includes a plurality of logic gates which are programmable by signals received on signal wiring. A memory macrocell includes a memory array which has a plurality of data lines, a y-switch circuit by which said data liens are selectively connected to a sense amplifier, and a pull-up circuit which is disposed in correspondence with said data lines. The pull-up circuit is arranged between the memory array and the y-switch.

In accordance with yet another aspect of the present invention, the semiconductor integrated circuit device includes a semiconductor substrate. A plurality of logic blocks are formed on the substrate. Each logic block includes a plurality of logic gates which are programmable by signals received on signal wiring. A plurality of clock signal distribution circuits are disposed generally centrally on the substrate. A plurality of memory macrocells are dispersively arranged on the semiconductor substrate. Each memory macrocell includes a memory mat and a peripheral circuit. All of the memory macrocells are arranged the same distance from a corresponding one of the clock signal distribution circuits.

In accordance with still another aspect of the present invention, a semiconductor integrated circuit device includes a logic block, a plurality of memory macrocells, and a clock signal distribution circuit. The logic circuit block includes a plurality of logic gates which are programmable by signals received on signal wiring. The memory macrocells are dispersively arranged on a semiconductor substrate. Each memory macrocell includes a memory mat and a peripheral circuit. The clock signal distribution circuit is positioned substantially centrally of the memory macrocells for relaying and distributing internal ECL level complementary clock signals thereamong. The clock signal distribution circuit includes a current switch and a bipolar CMOS hybrid circuit. The current switch includes differential bipolar transistors which receive a first supply voltage through a first supply voltage feed point. The bipolar CMOS hybrid circuit includes at least one of bipolar transistors and MOSFETs which receive a second supply voltage through a second supply voltage feed point.

One advantage of the present invention is that the number of the spanning wiring lines between each RAM macrocell and the gate array is reduced. The transmission path of the output signal of the RAM macrocell is shortened suppressing the skew between the bits thereof.

Another advantage of the present invention is that layout design is efficient and is reduced.

Another advantage of the present invention is that the operation functions of the RAM memory is stabilized, even at higher operating speeds.

Another advantage of the present invention is that fluctuation of a supply voltage in the gate array portion is suppressed.

Yet another advantage of the present invention resides in the suppression of the mutual interference between signals transmitted with the ECL levels and signals transmitted with the MOS levels. The skew between bits is suppressed.

Still another advantage of the present invention is that the spanning wiring lines between the RAM macrocell and the gate array portion and the start points and end points thereof replaceable at will to improve layout efficiency.

Yet another advantage of the present invention is that N-channel MOSFETs can be prevented from falling into reverse-biased states and from being latched up. Fluctuation of the supply voltage on a current switch circuit side attendant to the change of the operating current of the bipolar-CMOS hybrid circuit is suppressed to stabilize operation of the memory.

Still further advantages of the present invention will become apparent to those of ordinary skill in the art upon reading and understanding the following detailed description.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Basic Construction of Memory with Logic Functions

Figure 1:
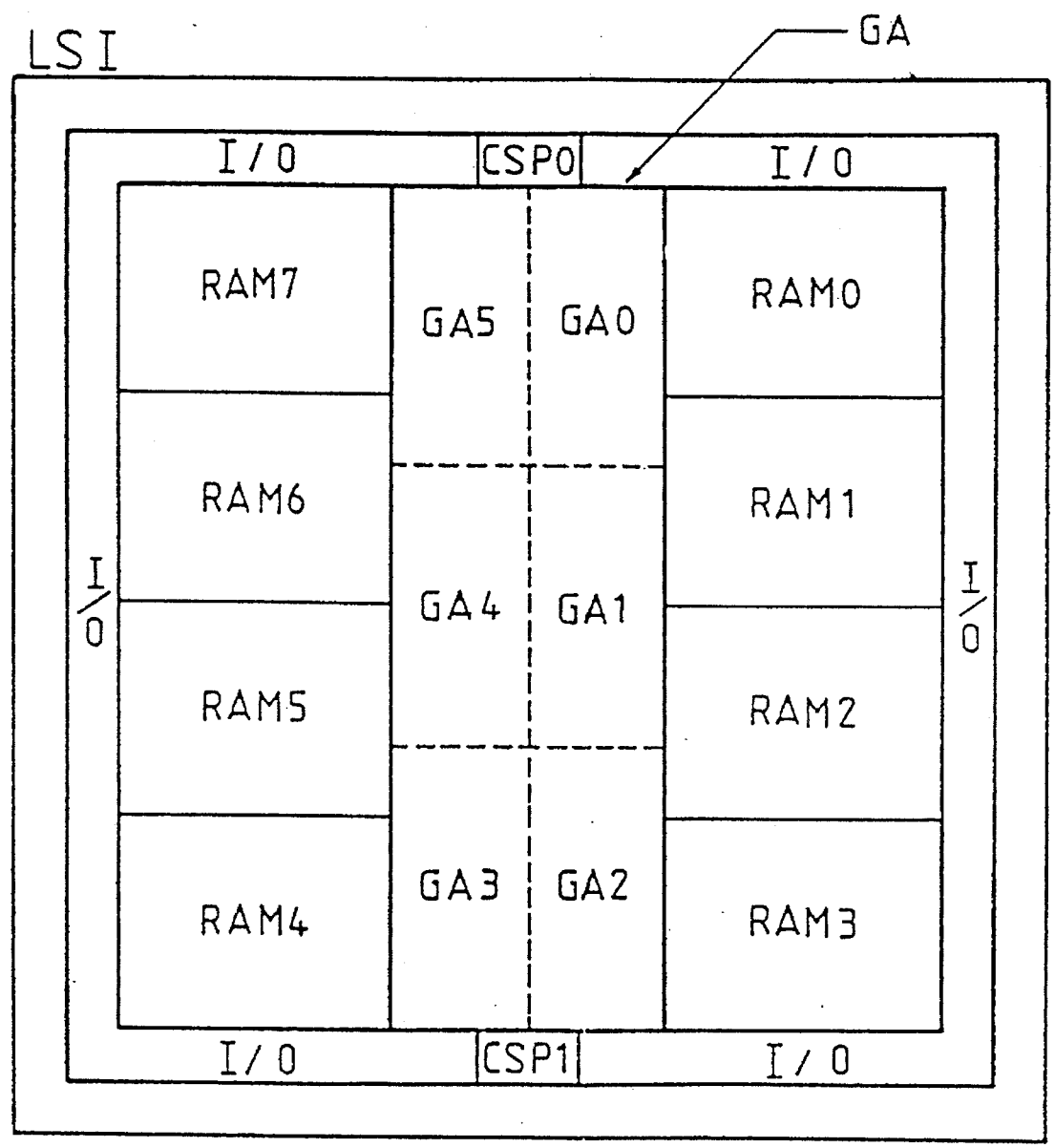
FIG. 1 is a substrate arrangement diagram of a RAM memory in accordance with the present invention.

With reference to FIG. 1, a memory with logic functions (LSI) comprises RAM macrocells (RAM0–RAM7). Four groups are symmetrically arranged on each side of a common square semiconductor substrate of approximately 10 mm (millimeters)×10 mm. In the illustrated embodiment, the single semiconductor substrate is of P-type single-crystal silicon. A gate array portion GA is arranged centrally of the semiconductor substrate between the groups of RAM macrocells. The RAM macrocells and the gate array portion are surrounded with an input/output portion I/O and clock shaping circuits CSP0 and CSP1 constituting a clock group circuit, which are further surrounded with a large number of bonding pads (not shown). The gate array portion GA is divided into six parts GA0–GA5 in conformity with the arrangement of clock switch amplifiers CSA0–CSA9. This division of the gate array portion does not have any functional significance.

In this embodiment for example, each of the eight RAM macrocells has a storage capacity of 24 bits×2048 words, for the memory with a storage capacity of 393216 bits in total. In addition, as will be explained later in the specification, the gate array portion GA includes about 1000 unit gate array cells, the number of gates thereof exceeding 11 kilogates.

The LSI memory is preferably used for the buffer storage of a central processing unit of a computer or the like. The levels of signals to be input to or output from the memory with logic functions are all set as ECL levels in correspondence with the interface of the system bus of the computer. On the other hand, various portions of the LSI memory are constructed of CMOS (complementary MOS) circuits, bipolar-CMOS hybrid circuits, or ECL circuits. The levels of signals to be transmitted internally are selectively set as ECL levels or MOS levels in conformity with the basic circuit arrangements of the portions. For this reason, the input/output portion I/O of the LSI memory includes a plurality of input circuit cells. Some of the input signals are transmitted at the ECL levels and others are converted into the MOS levels before being transmitted to the selected memory portions. A plurality of output circuit cells unify output signals at the ECL levels and signals at the MOS levels into the ECL levels for delivery.

Input/Output Portion

Figure 2:
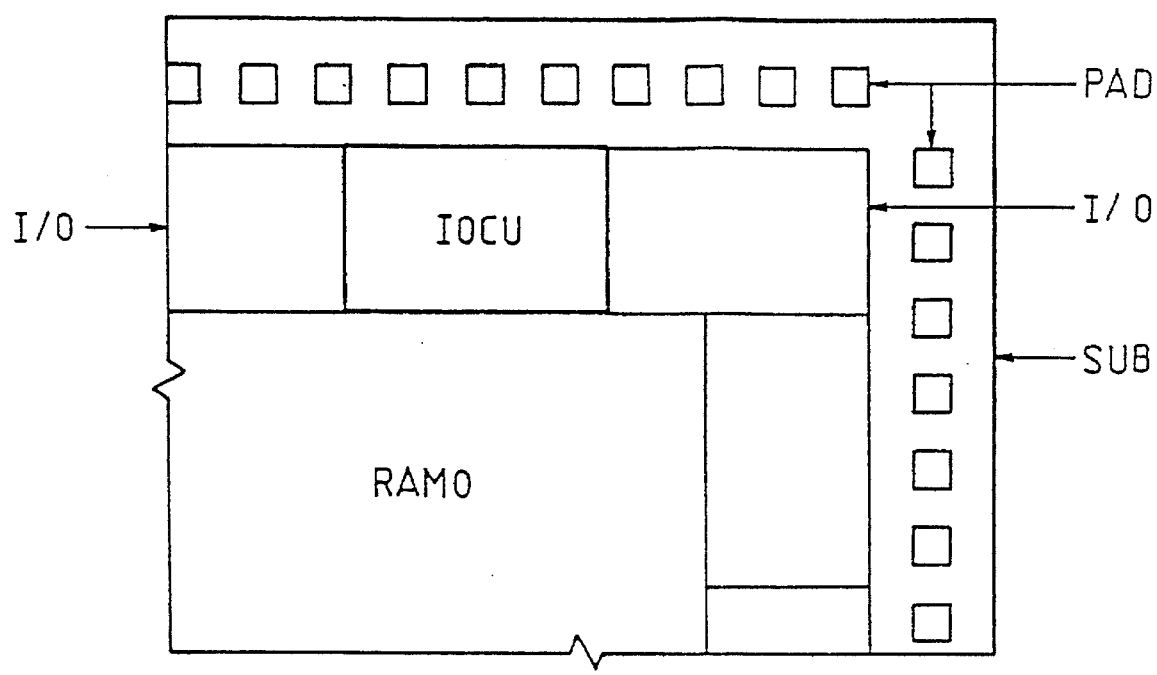
FIG. 2 is a partial arrangement diagram of an input/output portion of the memory of FIG. 1.

With reference to FIG. 2, a partial arrangement diagram of an embodiment of the input/output portion I/O of the LSI memory of FIG. 1 is shown. The input/output portion I/O comprises about 30 input/output circuit cell units IOCU. The RAM macrocells (RAM0–RAM7) are arranged inside the input/output circuit cell units. A plurality of bonding pads PAD including protective circuits are arranged outside them as exemplified in FIG. 2.

Input/Output Circuit Cell Unit

Figure 3:
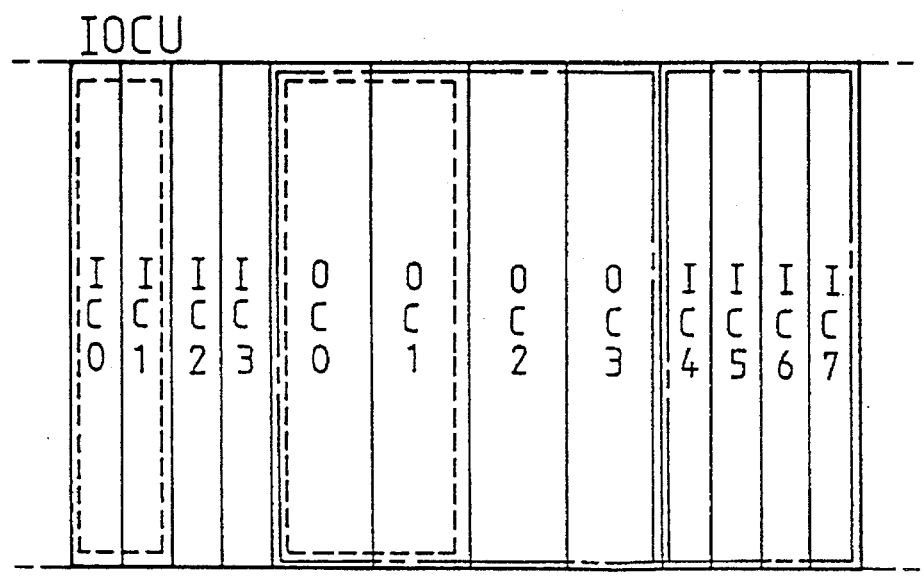
FIG. 3 is an arrangement diagram of an input/output circuit cell unit of the input/output portion of FIG. 2.
Figure 4:
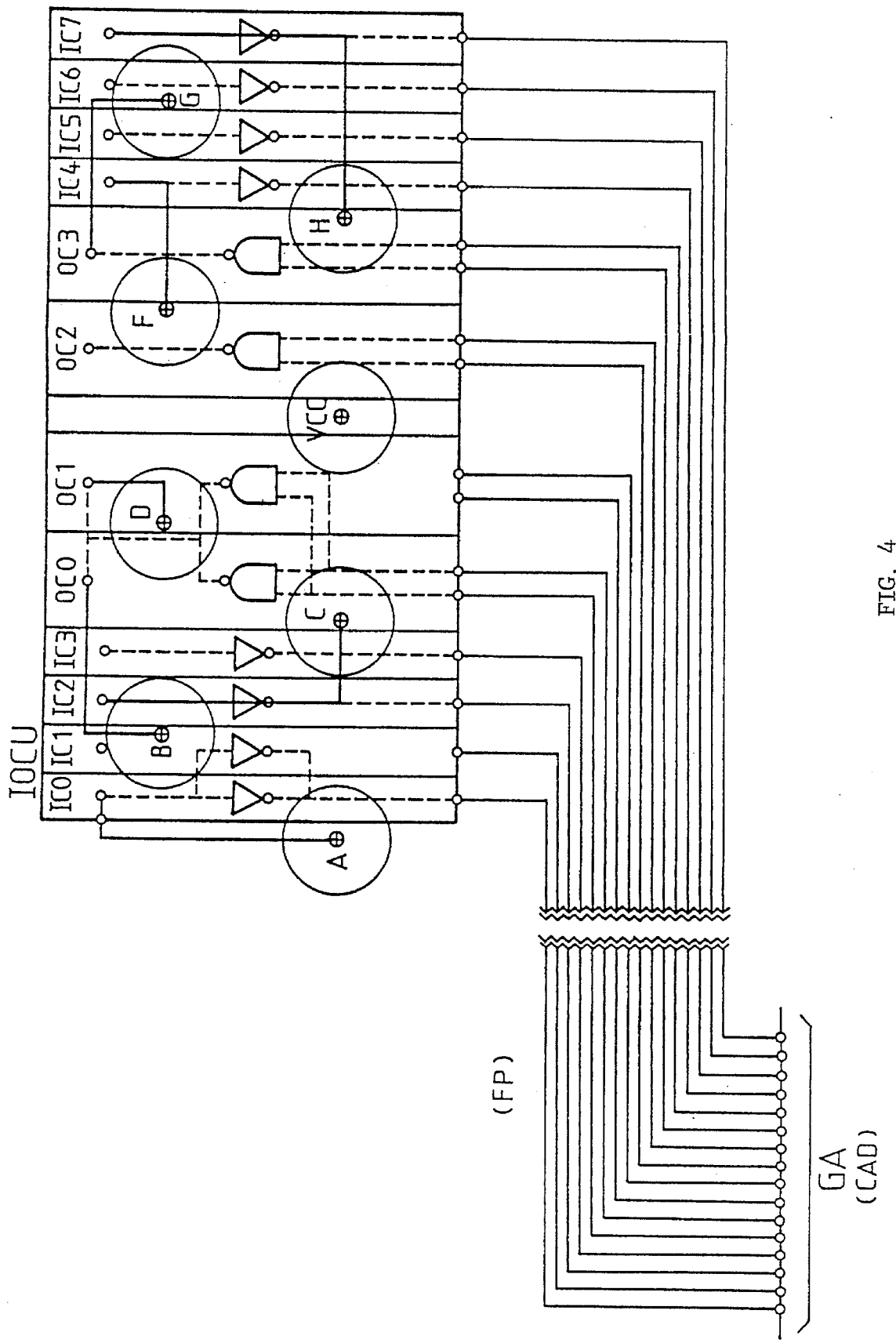
FIG. 4 is a connection diagram of the input/output circuit cell unit of FIG. 3.
Figure 13:
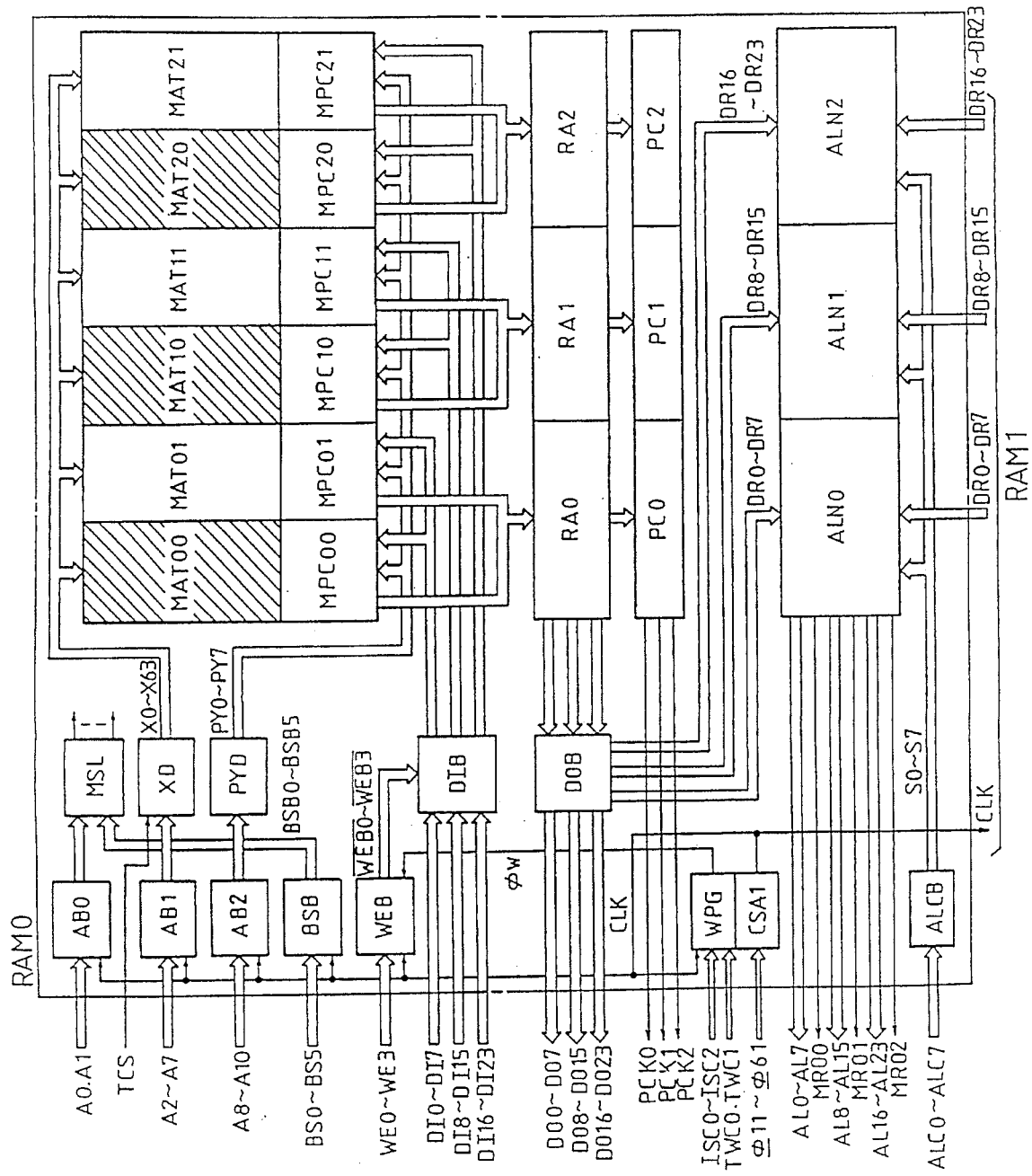
FIG. 13 is a more detailed-block diagram of the RAM macrocell of FIG. 12.

With reference now to FIGS. 3 and 4, an arrangement diagram of a preferred embodiment of the input/output circuit cell unit IOCU constituting the input/output portion I/O in FIG. 2 is illustrated. FIG. 13 shows a connection diagram of the embodiment.

Referring to FIG. 3, each of the input/output circuit cell units IOCU of the input/output portion I/O includes four proximately located output circuit cells OC0–OC3, and eight input circuit cells IC0–IC3 and IC4–IC7, four of which are arranged in proximity on each side of the output circuit cells.

In the base chip of the memory with logic functions, the input terminals and output terminals of the output circuit cells OC0–OC3 and input circuit cells IC0–IC7 are open without any connection at the respective receiving ends and sending ends thereof as exemplified in FIG. 4. The input circuit cells IC0 and IC1 and the output circuit cells OC0 and OC1 are connected in parallel to afford a driving capability which is about double. These output terminals and input terminals are respectively coupled to the input terminals or output terminals of corresponding internal circuits or bumps A–H etc. Corresponding metal wiring layers are selectively formed by the use of photomasks conforming to user specifications. Thus, the output circuit cells and input circuit cells are selectively brought into service states singly or in combinations.

By way of example, in a case where an output circuit and an input circuit require no high driving capability or serve to transmit only non-inverted or inverted signals, the output circuit cells OC0–OC3 and the input circuit cells IC0–IC7 are respectively used singly. In contrast, in a case where an output circuit or an input circuit, requires a comparatively high driving capability or serves to transmit complementary signals, the output circuit cells OC0–OC3 and the input circuit cells IC0 IC7 are used in the combinations of two cells or four cells as exemplified by dotted lines or dot-and-dash lines in FIG. 4.

In this manner, each input/output circuit cell unit is configured of the four output circuit cells and the eight input circuit cells. The cells are selectively combined according to the intended use of the signals to be transmitted or the load driving capability. In this manner, the system versatility of the input/output portion I/O is enhanced, and the serviceability is improved.

Input Circuit Cell

Figure 5:
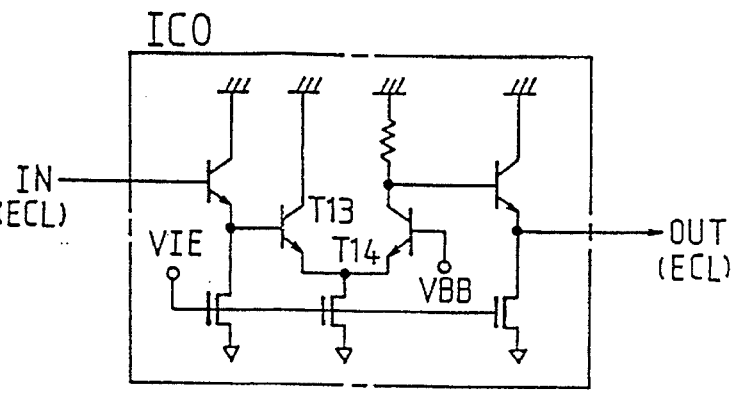
FIG. 5 is a circuit diagram of an input circuit cell of the input/output circuit cell unit of FIG. 2.
Figure 6:
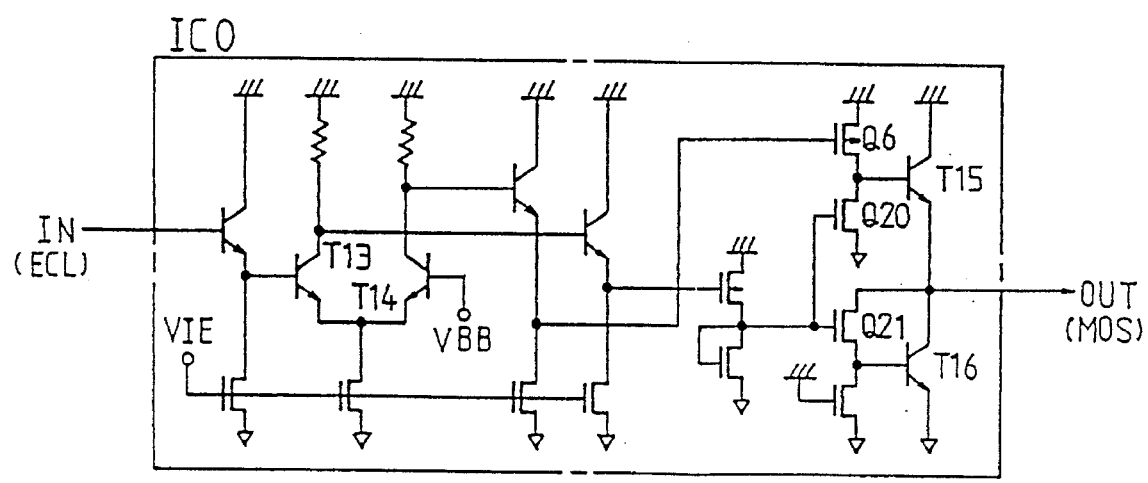
FIG. 6 is a circuit diagram of an alternate embodiment of the input circuit cell of the input/output circuit cell unit of FIG. 2.

With reference now to FIG. 5, a circuit diagram of an embodiment of the input circuit cell IC0 which is included in the input/output cell unit IOCU in FIG. 3 is shown. FIG. 6 shows a circuit diagram of another embodiment thereof.

The input signals which are supplied from external devices to the memory with logic functions are set in terms of ECL levels. They are transmitted to the corresponding internal circuits as the ECL levels left intact or after being converted into MOS levels. In the input/output portion I/O of the memory with logic functions, the input circuit cell shown in FIG. 5 is employed when the input signal is transmitted to the internal circuit as the ECL levels left intact. The input circuit cell in FIG. 6 is employed when the input signal is converted into the MOS levels and then transmitted to the internal circuit. In this example, the input circuit cells in FIGS. 5 and 6 are incorporated as common circuits in the base chip of the memory with logic functions. The two circuit arrangements are selectively realized by changing-over part of the photomask of a metal wiring layer.

With reference to in FIG. 5, the input circuit cell ICO includes an input emitter follower circuit which receives the input signal IN of ECL levels. The output of the input emitter follower circuit is fed to the base of one bipolar transistor (hereinbelow, simply termed "transistor") T13 constituting a differential circuit. The base of the other transistor T14 constituting the differential circuit is fed with a predetermined reference potential VBB. Thus, the differential circuit operates as a current switch circuit of which logic threshold is the reference potential VBB.

The non-inverted output signal of the current switch circuit is used as the output signal OUT of the input circuit cell ICO via an output emitter follower circuit. The output signal is transmitted to the corresponding internal circuit at the ECL levels.

In FIG. 6, the input circuit cell ICO includes, besides the input emitter follower circuit and the differential circuit in FIG. 5, a pair of output emitter follower circuits which transmit the non-inverted and inverted output signals of the differential circuit. The non-inverted output signal of the differential circuit is transmitted to the gate of a P-channel MOSFET Q6 constituting a level conversion circuit. The inverted output signal thereof is inverted and is thereafter transmitted to the gates of two N-channel MOSFETs Q20 and Q21 constituting the level conversion circuit. This level conversion circuit further includes a pair of output transistors T15 and T16 which are disposed in a totem pole form between the ground potential (first power source voltage) and supply voltage (second power source voltage) of the circuitry. The potential of the emitter and collector of the output transistors coupled in common is used as the output signal OUT of the input circuit cell ICO. The output signal is transmitted to the corresponding internal circuit.

In the embodiments described below, the supply voltage of the circuitry is set at a minus power source voltage of, e.g., −5.2 V.

When the input signal IN is set at the high one of the ECL levels, the non-inverted output signal of the differential circuit becomes a high level such as the ground potential of the circuitry, and the inverted output signal thereof becomes a low level as predetermined. Consequently, the output transistor T15 falls into its "on" state, and the output signal OUT of the input circuit cell ICO is brought to the high one of the MOS levels close to the ground potential of the circuitry. When the input signal IN is set at the low one of the ECL levels, the non-inverted output signal of the differential circuit becomes the predetermined low level, and the inverted output signal thereof becomes the high level. In consequence, the output transistor T16 falls into its "on" state instead, and the output signal OUT of the input circuit cell ICO is brought to the low one of the MOS levels close to the supply voltage of the circuitry.

Because the output levels of the input circuit cells ICO–IC7 are selectively switched, the levels of the internal signals are freely selectable in correspondence with the internal Circuits of the receiving sides.

Output Circuit Cell

Figure 7:
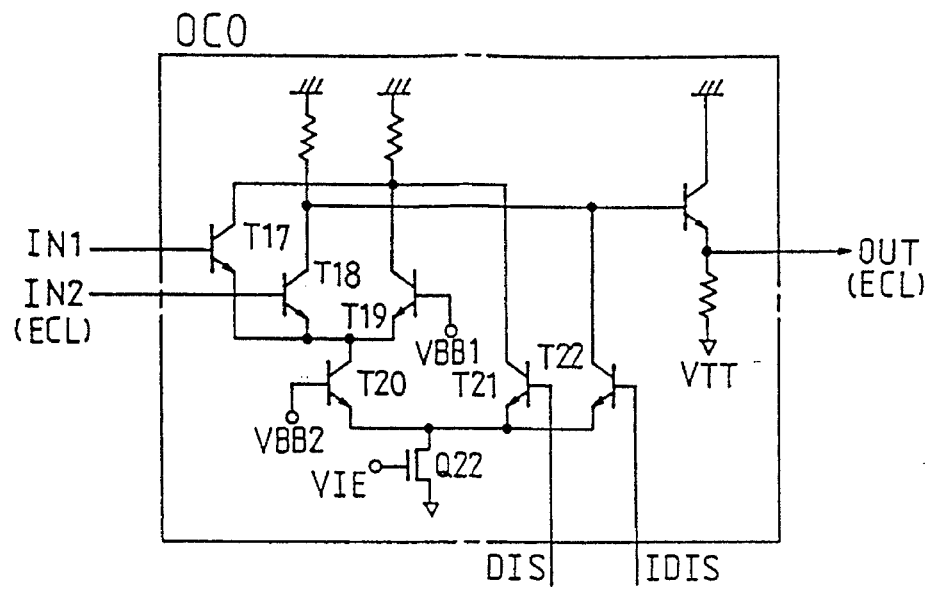
FIG. 7 is a circuit diagram of an output circuit cell of the input/output circuit cell unit of FIG. 2.
Figure 12:
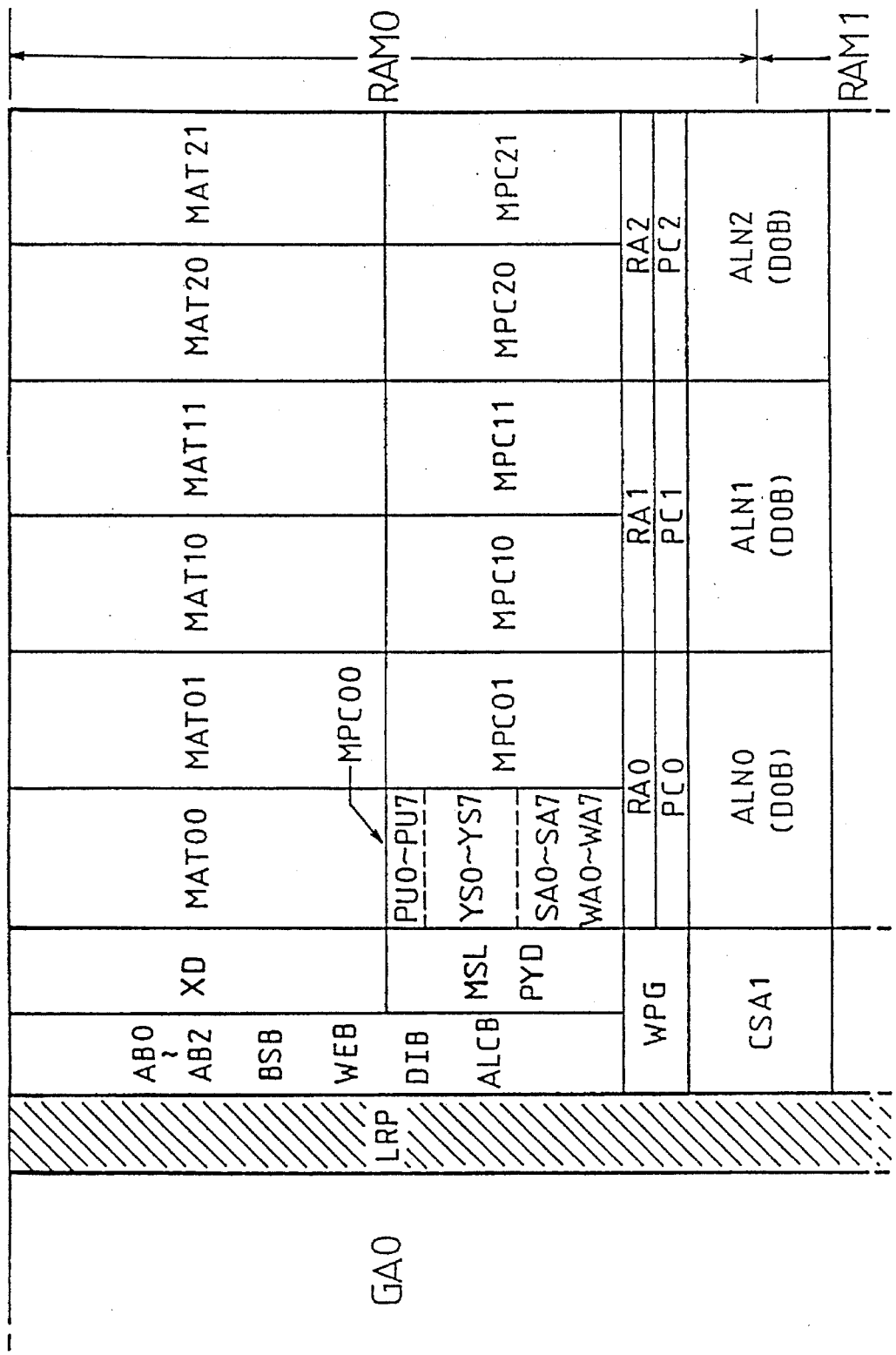
FIG. 12 is a diagrammatic illustration of a RAM macrocell of the memory of FIG. 1.
Figure 17:
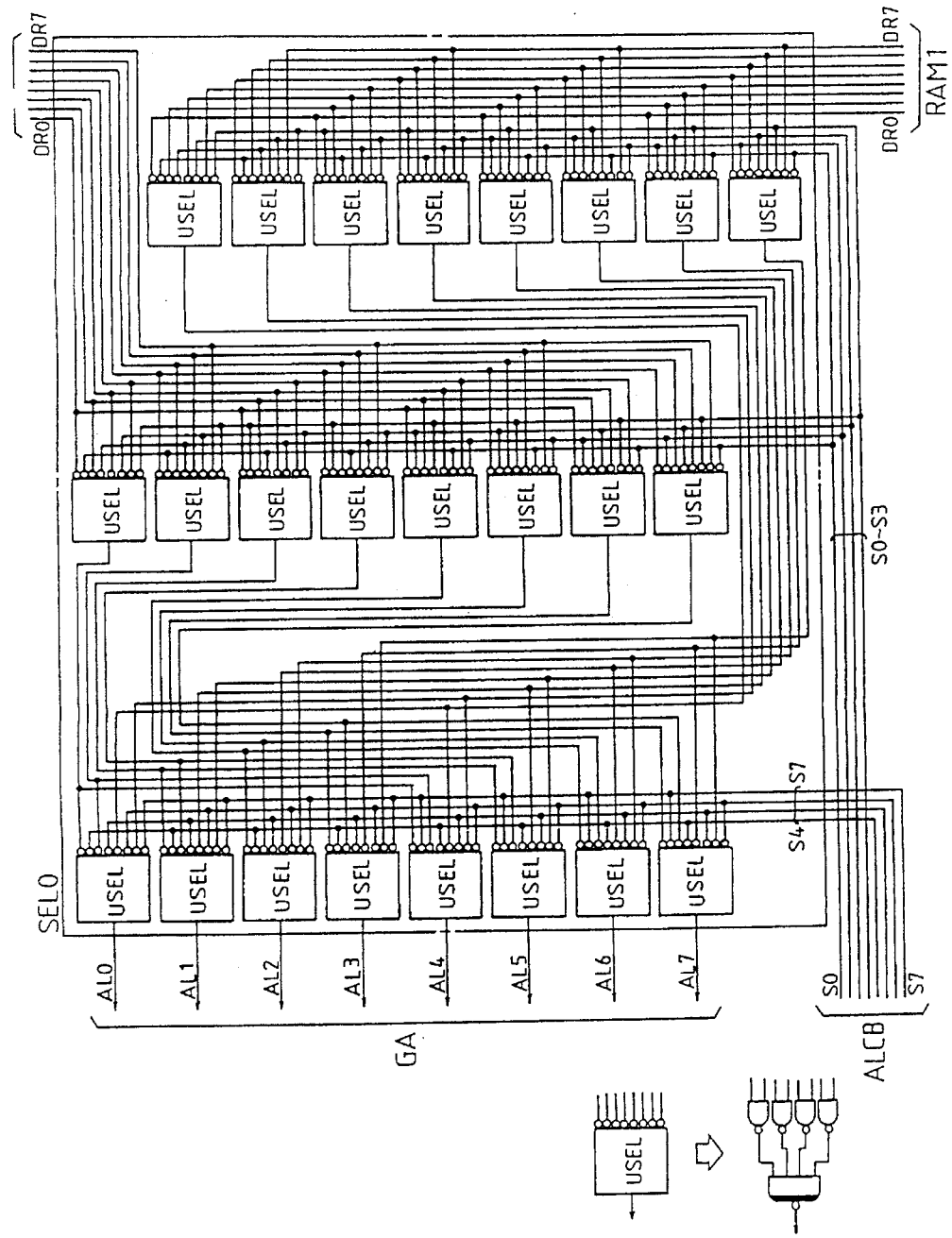
FIG. 17 is a circuit diagram of a selector circuit of the aligner of FIG. 16.

Referring now to FIG. 7, a circuit diagram of an embodiment of the output circuit cell OCO which is included in the input/output cell unit IOCU in FIG. 12 is shown. FIG. 17 shows a circuit diagram of another embodiment thereof. MOSFETs (metaloxide-semiconductor field effect transistors, and which shall be a general term for insulated-gate field effect transistors in this specification) with arrows affixed to their channel (back-gate) portions are of the P-channel type. By distinction, N-channel MOSFETs are illustrated with no arrows affixed. The illustrated bipolar transistors are N-P-N transistors.

Figure 8:
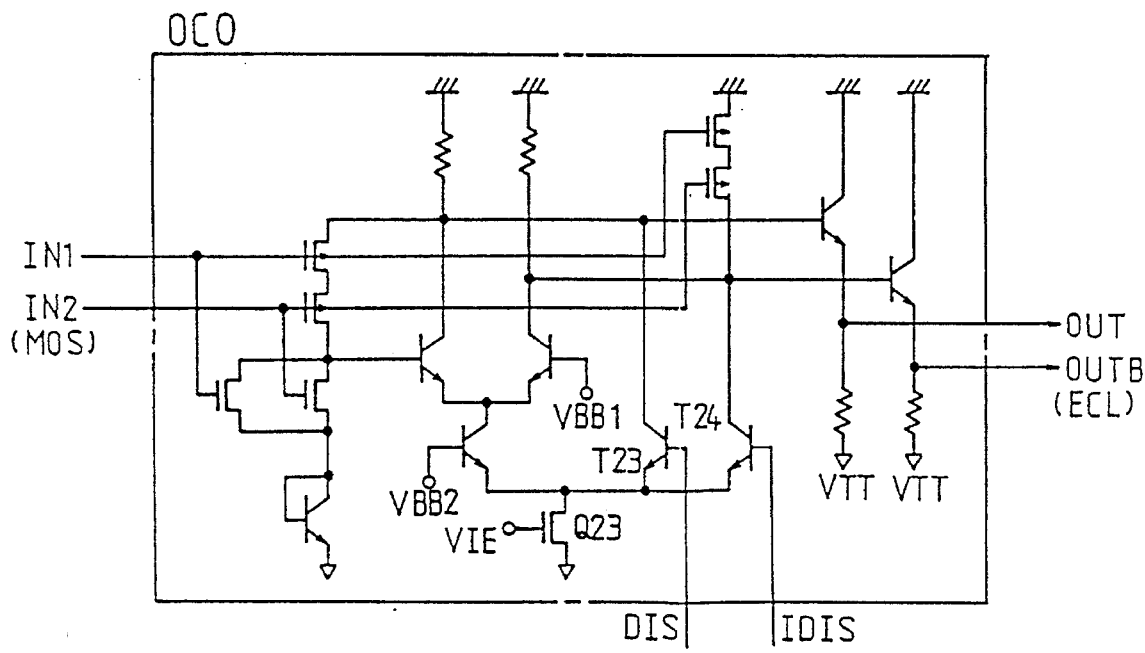
FIG. 8 is a circuit diagram of an alternate embodiment of the output circuit cell of the input/output circuit cell unit of FIG. 2.

The output signals which are sent out of the memory with logic functions are set in terms of ECL levels, and the internal signals of the memory are set selectively in terms of ECL levels or MOS levels as may be needed. Accordingly, the internal signals of the ECL levels are sent out as they are, but the .internal signals of the MOS levels are once converted into ECL levels and are thereafter sent out. In the input/output portion I/O of the memory with logic functions, the output circuit cell shown in FIG. 7 is employed when the internal signal to be output is at the ECL levels, and the output circuit cell shown in FIG. 8 is employed when the internal signal is at the MOS levels. In this example, the output circuit cells in FIGS. 7 and 8 are incorporated as common circuits in the base chip of the memory with logic functions. They are selectively realized by changing-over part of the photomask of a metal wiring layer.

In FIG. 7, the output circuit cell OCO includes a pair of input transistors T17 and T18 which are connected in parallel and which receive the input signals IN1 and IN2 of ECL levels at their respective bases, and another transistor T19 which is connected in a differential form with respect to the input transistors and which receives a predetermined reference potential VBB1 at its base. Thus, these transistors operate as a current switch circuit whose logic threshold is the reference potential VBB1.

The emitters coupled in common, of the three transistors constituting a differential circuit are coupled to the drain of an N-channel MOSFET Q22 constituting a regulated current source, through a transistor T20 which receives a predetermined reference potential VBB2 at its base. In addition, the non-inverted output node of the differential circuit is coupled to the drain of the MOSFET Q22 through a control transistor T21 which receives an internal control signal DIS at its base, while the inverted output node thereof is coupled in common with the drain of the MOSFET Q22 through another control transistor T22 which receives an internal control signal IDIS at its base. The inverted output signal of the differential circuit is passed via an output emitter follower circuit, and is thereafter sent out of the memory with logic functions in terms of the ECL levels left intact and as the output signal OUT of the output circuit cell OCO.

The differential circuit of the output circuit cell OCO is selectively brought into its operating state under the condition that both the internal control signals DIS and IDIS are at the low level. On this occasion, the output signal OUT of the output circuit cell OCO is selectively set at the high ECL level under the condition that both the input signals IN1 and IN2 are at the low level. When the internal control signal IDIS is set at the high level, the output signal OUT of the output circuit cell OCO is fixed to the low level irrespective of the logic levels of the input signals IN1 and IN2.

In the embodiment of FIG. 8, the output circuit cell OCO includes a CMOS NOR gate circuit which receives the input signals IN1 and IN2 of MOS levels, and a differential circuit which receives the inverted output signal of the CMOS NOR gate circuit. The non-inverted output node of the differential circuit is coupled to the drain of a MOSFET Q23 constituting a regulated current source, through a control transistor T23 which receives an internal control signal DIS at its base, and it is further coupled to the non-inverted output terminal OUT of the output circuit cell OCO through a corresponding output emitter follower circuit. Likewise, the inverted output node of the differential circuit is coupled in common with the drain of the MOSFET Q23 through another control transistor T24 which receives an internal control signal IDIS at its base, and it is further coupled to the inverted output terminal OUTB of the output circuit cell OCO through a corresponding output emitter follower circuit.

The differential circuit of the output circuit cell OCO is selectively brought into its operating state under the condition that both the internal control signals DIS and IDIS are at the low level. On this occasion, under the condition that either the input signal IN1 or IN2 is set at the high MOS level, the non-inverted output signal OUT of the output circuit cell OCO is selectively brought to the high ECL level, and the inverted output signal OUTB to the complementary signal of the non-inverted output signal OUT. When the internal control signal DIS is set at the high level, the non-inverted output signal OUT of the output circuit cell OCO is fixed to the low level irrespective of the logic levels of the input signals IN1 and IN2. Likewise, when the internal control signal IDIS is set at the high level, the inverted output signal OUTB of the output circuit cell OCO is fixed to the low level irrespective of the logic levels of the input signals IN1 and IN2.

In this manner, the input levels of the output circuit cells OCO–OC3 can be selectively switched, whereby the levels of the internal signals are freely selectable in correspondence with the internal circuits of the sending sides.

Gate Array Portion

Layout of Gate Array Portion

Figure 9:
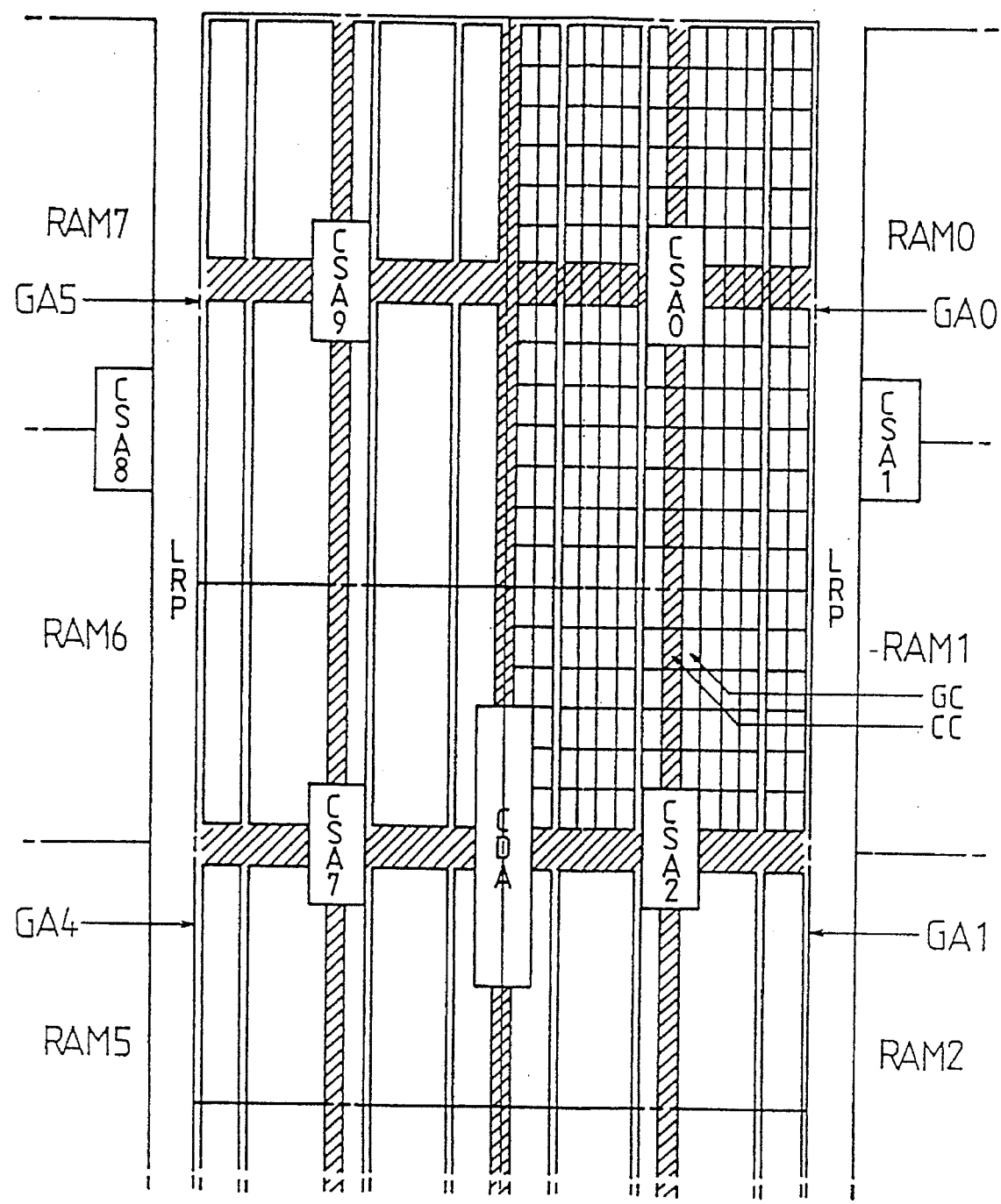
FIG. 9 is a partial arrangement diagram of the gate array portion of the memory of FIG. 1.

With reference now to FIG. 9 a partial arrangement diagram of an embodiment of the gate array portion GA in FIG. 1 is shown.

In this embodiment, the gate array portion GA includes about 1000 unit gate array cells GC, which are grouped into the blocks of the six gate array parts GA0–GA5 as indicated by the dotted lines in FIG. 1. As is explained in greater detail below, the gate array parts GA0–GA5 are respectively supplied with predetermined complementary internal clock signals from corresponding clock switch amplifiers CSA0, CSA2, CSA4, CSA5, CSA7 and CSA9.

In this embodiment, the gate array portion GA includes unit gate array cells GC which are grouped into blocks as indicated by hatching in FIG. 9. The hatched region includes a plurality of unit capacitor cells CC each of which has the same area as that of the unit gate array cell GC. As is explained below in greater detail, the unit capacitor cells are all coupled in common and operate as a power source smoothing capacitor, e.g. about 5000 pF (picofarads). The fluctuations of the supply voltage of the circuitry, which are attendant upon the operations of the plurality of unit gate array cells constituting each block of the gate array portion GA, are absorbed and suppressed by the unit capacitor cells CC which surround the unit gate array cells. As a result, the operation of the gate array portion GA is stabilized.

Of course, the number of the unit gate array cells GC surrounded with the unit capacitor cells CC is set in conformity with the balance between the quantity of the fluctuations of the supply voltage to be generated by these unit gate array cells and the quantity of the fluctuations of the supply voltage to be absorbed by the unit capacitor cells CC. These unit capacitor cells CC are formed under the layers of supply voltage feed wiring and ground potential feed wiring. This attains effective utilization of the area of the semiconductor substrate.

Further, in the memory with logic functions in this embodiment, wiring line replacement regions LRP each having a predetermined width are interposed between the gate array portion GA (parts GA0–GA5) and the RAM macrocells (RAM0–RAM7) as will be described later.

Unit Gate Array cell and Unit Capacitor Cell

Figure 10:
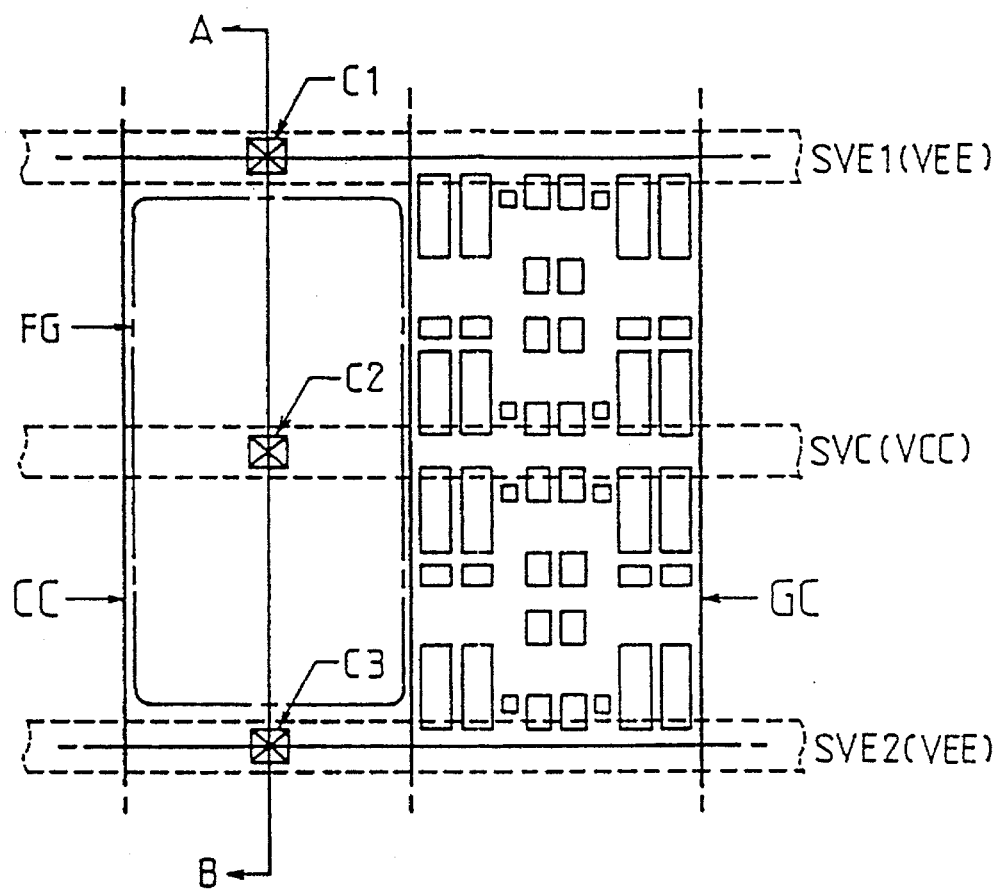
FIG. 10 is all arrangement diagram of a unit gate array cell and a unit capacitor cell of the gate array portion of FIG. 9.

Referring now to FIG. 10, an arrangement diagram of the unit gate array cells GC constituting the gate array portion GA, namely, parts GA0–GA5 in FIG. 9 is shown, as well as the unit capacitor cells CC surrounding these unit gate array cells, FIG. 10 shows a structural view of an embodiment of the unit capacitor cell CC taken along a section A–B.

Referring to FIG. 10, all the unit gate array cells GC of the gate array portion GA are formed with the same element construction. The circuit elements constituting each unit gate array cell GC are arranged in a rectangular region. The two length-wise and widthwise lateral of the arrangement have lengths at a ratio of approximately 1 to 2 as exemplified in FIG. 10. The ratio of the lengths of the lateral of the rectangle corresponds to the ratio of the lengths of the lateral of the entire region in which the gate array portion GA is laid out.

Each unit gate array cell GC is fed, as indicated by dotted lines in FIG. 10, with the ground potential (VCC) of the circuitry through a ground potential feed wiring line SVC and with the supply voltage (VEE) of the circuitry through supply voltage feed wiring lines SVE1 and SVE2. The ground potential feed wiring line and the supply voltage feed wiring lines include metal wiring layers made of aluminum and are coupled with the circuit elements of the unit gate array cell GC through predetermined contacts.

Figure 11:
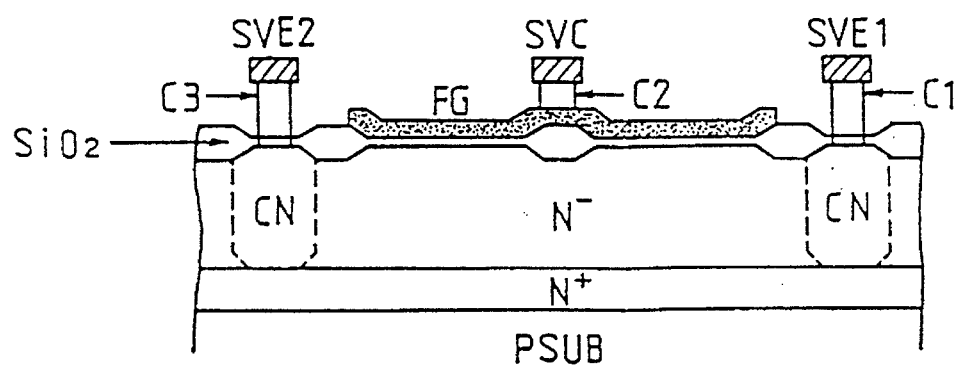
FIG. 11 is a sectional view of the unit capacitor cell of FIG. 10.

The unit capacitor cell CC includes, as shown in FIG. 11, an N-type well region N– which is formed on a P-type semiconductor substrate PSUB, and a polycrystalline silicon layer FG which is formed over the well region N– with a silicon oxide film (SiO2) intervening therebetween. The well region N– is underlaid with an N-type diffused layer N+ for lowering the resistance of the substrate, and connection regions CN are provided on both the sides of the well region N–. The polycrystalline silicon layer FG is coupled to the ground potential feed wiring line SVC through a contact C2. Each of the pair of connection regions CN is coupled to the supply voltage feed wiring line SVE1 or SVE2 through a corresponding contact C1 or C3. Thus, a so-called MOS capacitor is formed between the polycrystalline silicon layer FG and the well region N–, and a capacitance conforming to the opposing area of the layer and the region is obtained.

In this manner, the unit capacitor cell CC is formed with substantially the same area as that of the unit gate array cell GC. In this manner, the polycrystalline silicon layer FG and ground potential feed wiring line SVC, and the connection regions CN and .supply voltage feed wiring lines SVE1 and SVE2 are coupled comparatively easily, i.e. the layout design of the unit capacitor cells CC is efficient.

RAM Macrocell

As stated before, the memory with logic functions in this embodiment comprises the eight RAM macrocells (RAM0–

–RAM7). The RAM macrocells include bipolar-CMOS type RAMs, each of which has a storage capacity of 24 bits×2048 words. Of the eight RAM macrocells, those RAM0 and RAM1, RAM2 and RAM3, RAM4 and RAM5, and RAM6 and RAM7 are respectively combined to form pairs and to share parts. Now, the case of the RAM macrocell RAM0 will be taken as an example for describing the RAM macrocell in this embodiment and the arrangements, operating outlines, layouts and features of the several circuit blocks thereof. The other RAM macrocells shall be inferred from the description of the RAM macrocell RAM0.

Block Arrangement of RAM Macrocell

Figure 14:
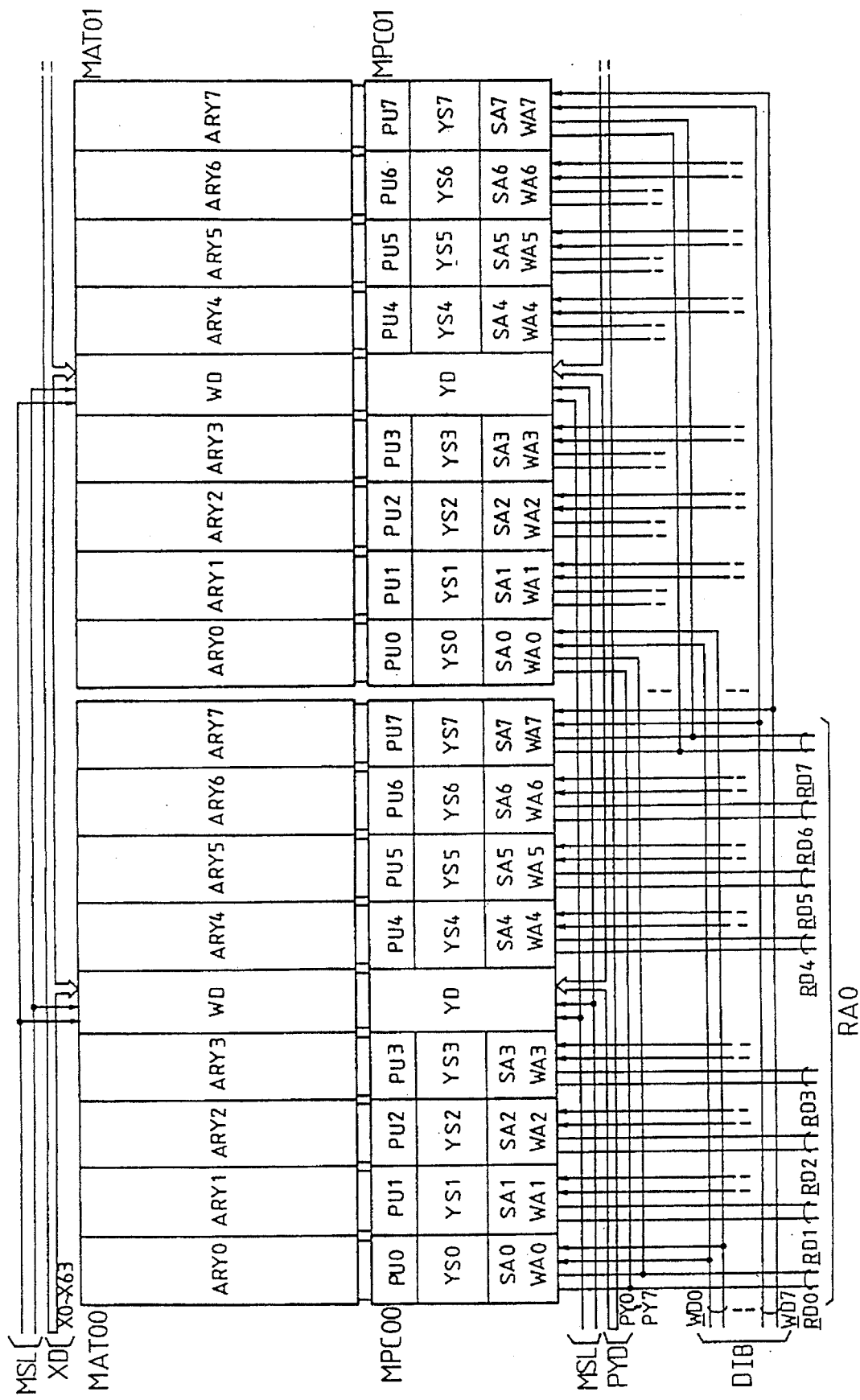
FIG. 14 is a partial block diagram showing a memory mat and a mat periphery circuit of the RAM macrocell of FIG. 12.

With reference now to FIG. 13 a block diagram of an embodiment of the RAM macrocell (RAM0) of the memory with logic functions in FIG. 12 is shown. FIG. 14 shows a partial block diagram of the memory mats and mat periphery circuits of the RAM macrocell in FIG. 13.

Referring to FIG. 13, the RAM macrocell comprises six memory mats MAT00–MAT20 and MATu1–MAT21 which are arranged successively and alternately in the extending direction of word lines, and six mat periphery circuits MPC00–MPC20 and MPC01–MPC21 which are respectively disposed in correspondence with the memory mats. Two of the memory mats and the mat periphery circuits adjoining each other form a pair, and three read amplifiers RA0–RA2, parity check circuits PC0–PC2 and aligners (sequence control circuits) ALN0–ALN2 are further disposed in correspondence with the respective pairs of memory mats and mat periphery circuits.

In this embodiment, each of the memory mats MAT00–MAT20 and MAT01–MAT21 has a storage capacity of 8 bits ×1024 words as will be described later. Three of these memory mats MAT00–MAT20 and MAT01–MAT21, for which one memory mat is selected from each of the three pairs of memory mats as exemplified by hatching in FIG. 13, are simultaneously brought into active states. Each of the RAM macrocells is endowed with a storage capacity of 24 bits× 2048 words in total. The address spaces of the RAM macrocell are designated in an alternative way by address signals A0–A10 of 11 bits. Write data is afforded to the RAM macrocell as input data DI0–DI23 of 24 bits, and read data is delivered from the RAM macrocell as output data DO0–DO23 of 24 bits. In the RAM macrocell, the write data and read data of 24 bits are dividedly processed every 8 bits, namely, every byte, although not especially restricted.

The store data of 24 bits to be simultaneously input to or output from the RAM macrocell is further selected into six blocks each consisting of 4 bits, and the blocks are alternatively designated by block select signals BS0–BS6 of 6 bits. Herein, when the RAM macrocell is operated in its write mode, the 4 bits constituting each block are further designated alternatively in accordance with write enable signals WE0–WE3 of 4 bits, thereby making it possible to perform the control of alternatively writing the store data for the 24 bits which are simultaneously selected.

As typically shown by the memory mats MAT00 and MAT01 in FIG. 14, each of the memory mats MAT00–MAT20 and MAT01–MAT21 comprises memory arrays ARY0–ARY7 totaling eight, four of which are arranged on each side of a word line driving circuit WD. The respective blocks of the store data correspond to the four right or left memory arrays of the three individual memory mats which are simultaneously brought into the active states, and one of which is selectively brought into the active state by the write enable signals WE0 WE3. The word line driving circuit WD of each memory mat is supplied with predetermined memory mat and memory array upper/lower half select signals from a mat selecting circuit MSL, and with word line select signals X0–X63 from an X address decoder XD.

Each of the eight memory arrays ARY0–ARY7 of each memory mat includes 128 word lines, which are laid in the horizontal direction as viewed in FIG. 14, are alternatively brought into selected states. Eight sets of complementary data lines which are laid in the vertical direction, are alternatively brought into selected states. Thus, each of the memory arrays ARY0–ARY7 is endowed with a storage capacity of 1 bit×1024 words. In the illustrated embodiment, the 128 word lines constituting each memory array are grouped into upper and lower halves each consisting of 64 lines, and either of the halves is selectively designated in accordance with the memory array upper/lower half select signals.

Each of the mat periphery circuits MPC00–MPC20 and MPC01–MPC21 includes, as typically shown by the mat periphery circuits MPC00 and MPC01 in FIG. 14, one Y address decoder YD, and eight pull-up circuits PU0–PU7, Y switch circuits YS0–YS7, and sense amplifiers SA0–SA7 as well as write amplifiers WA0–WA7, which are disposed in correspondence with the memory arrays ARY0–ARY7. Among the constituents, the Y address decoder YD is supplied with predetermined memory mat or memory array select signals from the mat selecting circuit MSL and predecode signals PY0–PY7 from a Y predecoder PYD though not especially restricted. In addition, the write amplifiers WA0–WA7 are supplied with corresponding complementary write signals $\underline{WD0}$–$\underline{WD7}$ from a data input buffer DIB. (Here, a non-inverted write signal wD0 and an inverted write signal WDOB for example, shall be collectively expressed as the complementary write signals $\underline{WD0}$ Besides, so-called "inverted signals" each of which is usually held at its high level and is selectively set at its low level when it is validated, shall have Bs affixed to the tails of the names of the signals similarly to the inverted write signal WDOB. The same shall apply to complementary signals and complementary signal lines.) The output signals or sense currents of the sense amplifiers SA0–SA7 are transmitted to corresponding read amplifiers RA0–RA7 as complementary read signals $\underline{RD0}$–$\underline{RD7}$.

In FIG. 13, most of the input signals which are transmitted to the RAM macrocell are set at MOS levels except complementary clock signals $\phi 11$–$\phi 61$ and some internal control signals. Among the input signals, the address signals A0 A10 of 11 bits have their upper 2 bits, namely, the address signals A0 and A1 transmitted to the mat selecting circuit MSL through an address buffer AB0, so as to be used for the operations of selecting the memory mats and the upper or lower halves of the memory arrays. In addition, the address signals A8–A10 of the lower 3 bits are transmitted to the Y predecoder PYD through an address buffer AB2, so as to be used for the operation of selecting the eight sets of complementary data lines of each memory array. The address signals A2–A7 of the remaining 6 bits are transmitted to the X address decoder XD through an address buffer AB1, so as to be used for the operation of selecting the 64 word lines which are laid in the upper or lower half of each memory array.

Likewise, the block select signals BS0–BS5 are transmitted to the mat selecting circuit MSL through a block select signal buffer BSB, so as to be used for the operations of selecting the memory mats and the right or left parts of the memory arrays. In addition, the write enable signals WEO–WE3 are transmitted to the data input buffer DIB through a write enable signal buffer WEB, so as to be used for the write control. Further, the input data items DIO–DI123 are supplied to the write amplifiers of the corresponding memory mat periphery circuits MPCO–MPC20 and MPC01–MPC21 through the data input buffer DIB.

The read signals which are delivered through the corresponding mat periphery circuits from the selected memory cells of the memory mats MATOO–MAT20 and MAT01–MAT21 are amplified by the corresponding read amplifiers RAO–RA2. From the read amplifiers they are transmitted to the corresponding parity check circuits PCO–PC2 and to a data output buffer DOB at ECL levels.

The parity check circuits PCO–PC2 include ECL circuits, by which the parities of the read signals supplied from the corresponding read amplifiers RAO–RA2 are checked every 8 bits. The output signals of the parity check circuits PCO–PC2 converted into MOS levels therein are delivered as parity signals PCKO–PCK2.

The data output buffer DOB converts the read signals supplied from the read amplifiers RAO–RA2, into MOS levels, to send the resulting signals as the output data DOO–D023 and to supply them to the corresponding aligners ALNO–ALN2 as internal output data DRO–DR23.

The aligners ALNO–ALN2 are shared by the RAM macrocell RAMO and the other RAM macrocell (RAM1) forming the pair therewith. The aligners also receive similar internal output data DRO–DR23 of 24 bits delivered from the RAM macrocell RAM1. The aligners ALNO–ALN2 select the read data items of 48 bits in total or change the sequence thereof every byte in accordance with aligner control signals ALCO–ALC7 or select signals SO–S7 of 8 bits which are supplied through an aligner control signal buffer ALCB. In this embodiment, the aligners ALNO–ALN2 include diagnosing latch circuits by which, when the memory with logic functions is operated in a predetermined diagnosis mode, the read data items selected according to the aligner control signals are accepted and are subjected to so-called scan-out operations. The read data items subjected to the sequence control by the aligners ALNO–ALN2 are delivered as aligner output signals ALO–AL23, and the output signals of the diagnosing latch circuits are delivered as scan-out signals MROO–MR02.

The RAM macrocell further includes a clock switch amplifier CSA1 and a write pulse generating circuit WPG. The clock switch amplifier CSA1 of them is shared by the other RAM macrocell (RAM1) forming the pair. The clock switch amplifier forms a predetermined clock signal CLK on the basis of the complementary internal clock signals $\phi11$–$\phi61$ transmitted through a clock distribution circuit CDA and supplies the signal CLK to the various portions of the RAM macrocells.

The write pulse generating circuit WPG forms a predetermined write pulse $\phi w$ on the basis of the clock signal CLK supplied from the clock switch amplifier CSA1 and supplies the pulse to a write enable signal buffer WEB. In this embodiment, the rise time of the write pulse $\phi w$ is selectively changed-over according to internal control signals ISCO–ISC2, and the pulse width thereof is selectively changed-over according to internal control signals TWCO–TWC1.

Layout of RAM Macrocell

With reference now to FIG. 12, an arrangement diagram of an embodiment of the RAM macrocell (RAMO) in FIG. 13 is shown. Each of the other RAM macrocells (RAM1–RAM7) has an arrangement vertically or laterally symmetric to this macrocell RAMO though not especially restricted.

Referring to FIG. 12, the six memory mats MATOO–MAT20 and MAT01–MAT21 constituting the RAM macrocell are arranged in alignment so as to correspond to the block diagram of FIG. 13. The X address decoder XD is arranged on the left side of the memory mats, that is, on the inner side of the semiconductor substrate. Under these memory mats, the corresponding mat periphery circuits MPCOO–MPC20 and MPC01–MPC21, are adjoined by the mat selecting circuit MSL and the Y pre-decoder PYD on the left side thereof. In each mat periphery circuit, the pull-up circuits PUO–PU7 are arranged nearest the corresponding memory mat. The Y switch circuits YSO–YS7 and the sense amplifiers SAO–SA7 as well as the write amplifiers WAO–WA7 are arranged under the pull-up circuits, as typically shown in the mat periphery circuit MPCOO.

In this manner, the pull-up circuits PUO–PU7 are arranged under the corresponding memory mat, i.e. between the memory arrays including the complementary data lines and the corresponding Y switch circuits YSO–YS7. In this manner, the operations of pulling up the complementary data lines by the pull-up circuits is sped up.

Under the memory mats and mat periphery circuits forming the pairs, there are arranged the corresponding read amplifiers RAO–RA2 and parity check circuits PCO–PC2. Between the illustrated RAM macrocell and the pairing RAM macrocell (RAM1), in the extending direction of the complementary data lines of the memory mats or the memory arrays and midway between the two pairing RAM macrocells, there are arranged the aligners ALNO–ALN2 which are shared by these RAM macrocells. The output signals of these aligners are led leftward or inward of the semiconductor substrate, whereupon they are delivered out of the RAM macrocells beyond the clock switch amplifier CSA1.

In this manner, the aligners ALNO–ALN2 for selectively transmitting the output signals of both the RAM macrocells are arranged at the peripheries of the RAM macrocells, in other words, so as not to lie within the RAM macrocells, and in the extending direction of the complementary data lines, whereby the numbers of the spanning wiring lines between the RAM macrocells and the gate array portion GA are curtailed, and the transmission paths of the output signals of the RAM macrocells are sharply shortened. As a result, the layout design of the memory with logic functions is rendered more efficient, and the skews between the bits of the output signals are reduced to stabilize the operation of the memory with logic functions and to raise the operating speed thereof.

Next, the address buffers ABO–AB2, block select signal buffer BSB, write enable signal buffer WEB, data input buffer DIB and aligner control signal buffer ALCB are arranged on the ].eft side of the X address decoder XD and the mat selecting circuit MSL as well as the Y predecoder PYD. Further, the write pulse generating circuit WPG is arranged under these buffers, and the clock switch amplifier CSA1 which is shared by the illustrated RAM macrocell and the pairing RAM macrocell (RAM1) is arranged between these RAM macrocells. The above input buffers are arranged midway of the transmission paths of the corresponding input signals in order to shorten these transmission paths.

Meanwhile, in the memory with logic functions in this embodiment, the layout of the signal wiring lines concerning the RAM macrocells is chiefly designed by hand labor, whereas the layout of the signal wiring lines concerning the gate array portion GA is chiefly designed automatically by the use of a computer. In addition, since the scale of the memory with logic functions has been enlarged to increase the storage capacity of the RAM macrocells, the number of the signal wiring lines to be laid between each RAM macrocell and the gate array portion GA is as large as about 1000. As a result, the design of layout concerning these spanning wiring lines becomes very difficult with a conventional block arrangement. In order to cope with the difficulty, in the memory with logic functions in this embodiment, the wiring line replacement region LRP having the predetermined width is defined between the RAM macrocell and the gate array portion GA (part GAO). In this wiring line replacement region LRP, the signal wiring lines whose layout is designed by the hand labor in the RAM macrocell are replaced so as to have start points or end points suited to the automatic design based on the computer, whereby the layout design of the memory with logic functions is rendered efficient.

Memory Array and Peripheral Circuits Thereof

Figure 15:
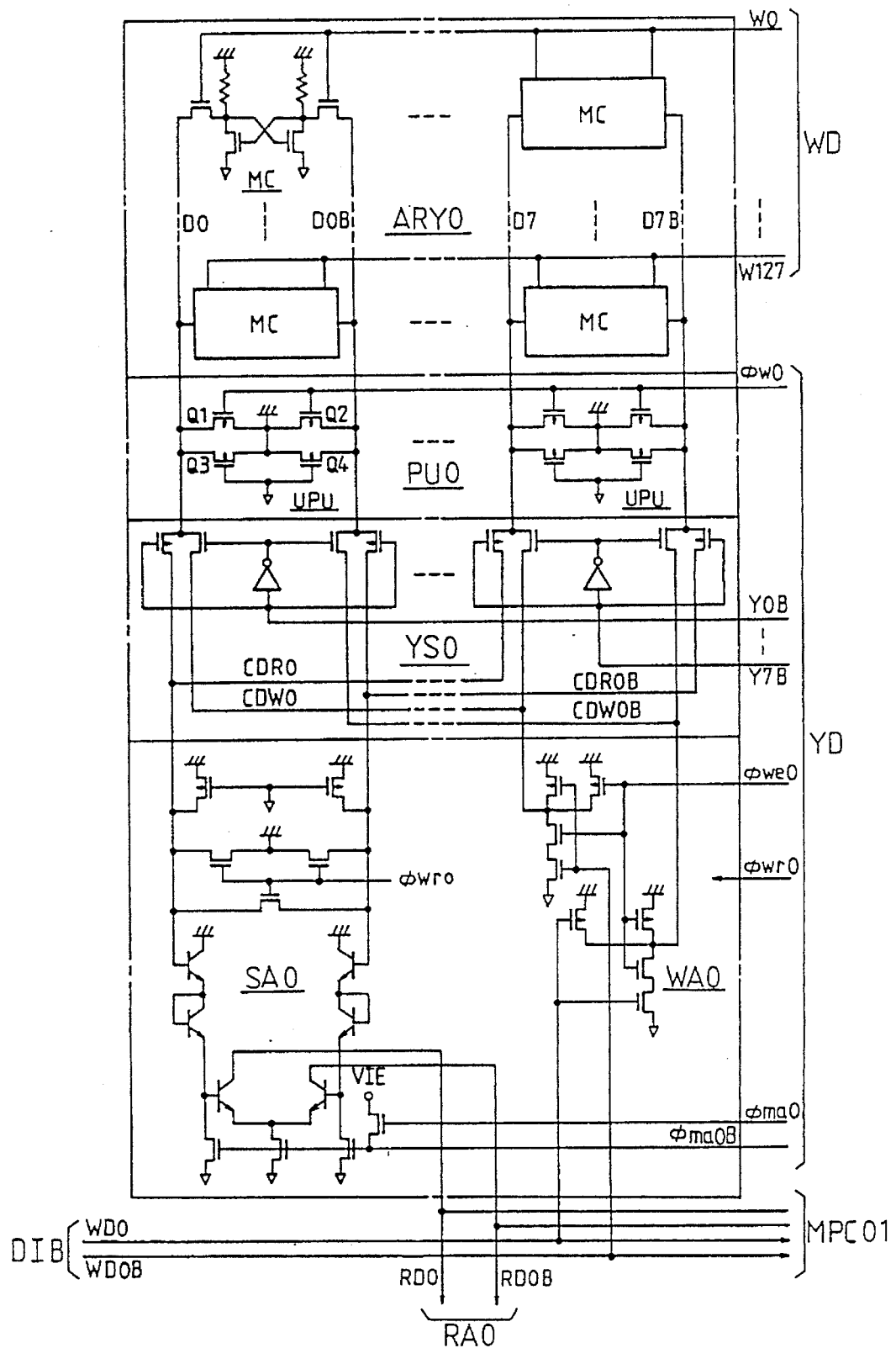
FIG. 15 is a partial circuit diagram of the memory mat and the mat periphery circuit of the RAM macrocell of FIG. 12.

With reference to FIG. 15, a partial circuit diagram of an embodiment of the memory mats MAT0O–MAT20 and MAT01–MAT21 and mat periphery circuits MPC0O–MPC20 and MPC01–MPC21 of the RAM macrocell (RAMO) in FIG. 13 is shown. By the way, although the memory array ARYO which is included in the memory mat MAT0O and the pull-up circuit PUO, the Y switch circuit YSO and the sense amplifier SAO as well as the write amplifier WAO which constitute the mat periphery circuit MPCOO are exemplified in FIG. 5, similar circuit arrangements are employed for the other memory arrays, pull-up circuits, Y switch circuits and sense amplifiers as well as write amplifiers which constitute the memory mat and mat periphery circuit mentioned above and for the other memory mats MAT10–MAT20 and MAT01–MAT21 and mat periphery circuits MPC10–MPC20 and MPC01–MPC21. Now, the practicable circuit arrangements, operating outlines, layouts and features of the memory mat and mat periphery circuit of the RAM macrocell in this embodiment are described in conjunction with the example of FIG. 15.

Referring to FIG. 15, the memory array ARYO of the memory mat MAT0O comprises 128 word lines W0–W127 which are laid horizontally as viewed in the figure, and eight sets of complementary data lines $\underline{D}0$–$\underline{D}7$ which are laid vertically. At the intersection points between the word lines and the complementary data lines high-resistance load type static memory cells MC numbering 128×8, namely, 1024 are arranged in the shape of a matrix.

The word lines W0–W127 constituting the memory array ARYO are coupled to the word line driving circuit WD via the three memory arrays ARY1–ARY3 associated with this memory array ARYO. In this embodiment, the word line driving circuit WD is shared by the eight memory arrays ARYO–ARY7 as stated before, and the word lines W0–W127 are also shared by these memory arrays and are arranged so as to penetrate across these memory arrays. Further, as stated before, the word lines W0–W127 are grouped in each memory array into the upper and lower halves each of which consists of the 64 lines and which are selectively brought into the active states in accordance with the memory array upper/lower half select signals delivered from the mat selecting circuit MSL. The word line driving circuit WD combines the memory array upper/lower half select signals with the word line select signals X0–X63 supplied from the X address decoder XD.. This brings the corresponding word lines W0–W127 alternately into the selected states of the high level.

The complementary data lines $\underline{D}0$–$\underline{D}7$ constituting the memory array ARYO are coupled to the corresponding Y switch circuit YSO via the corresponding pull-up circuit PUO of the memory mat periphery circuit MPCOO.

The pull-up circuit PUO of the memory mat periphery circuit MPCOO includes P-channel type pull-up MOSFETs Q1, Q2 and Q3, Q4 totaling 16 pairs, two pairs of which are respectively connected between the ground potential of the circuitry and the non-inverted and inverted signal lines of the complementary data lines $\underline{D}0$–$\underline{D}7$ constituting the memory array ARYO. Of the pull-up MOSFETs, one pair of pull-up MOSFETs Q1, Q2 are designed so as to have a comparatively high conductance, and the gates thereof are supplied in common with a timing signal φwO which is selectively set at the high level when the RAM macrocell is operated in the write mode. Besides, the other pair of P-channel MOSFETs Q3, Q4 are designed so as to have a comparatively low conductance, and the gates thereof are both coupled to the supply voltage of the circuitry.

When the RAM macrocell is operated in the read operation mode and the timing signal φwO is set at the low level, the two pairs of P-channel MOSFETs fall into their "on" states simultaneously in each unit circuit of the pull-up circuit PUO. Therefore, a comparatively high bias voltage is applied to the complementary data lines $\underline{D}O$–$\underline{D}7$ of the memory array ARYO, whereby the occurrence rate of soft errors ascribable to α-particles etc. is suppressed. In contrast, when the RAM macrocell is operated in the write mode and the timing signal φwO is set at the high level, only the P-channel MOSFETs Q3, Q4 having the comparatively low conductance fall into their "on" states in the pull-up circuit PUO. Therefore, a comparatively low bias voltage is applied to the complementary data lines $\underline{D}O$–$\underline{D}$& of the memory array ARYO, whereby a sufficient write signal amplitude is attained.

In this manner, the pull-up circuit PUO is arranged midway between the complementary data lines $\underline{D}O$–$\underline{D}7$ constituting the memory array ARYO and the Y switch circuit YSO, in other words, the corresponding sense amplifier SAO and write amplifier WAO, whereby the above-stated pull-up operation based on the pull-up circuit is raised in speed, and the effect is enhanced.

The Y switch circuit YSO includes eight pairs of P-channel MOSFETs and eight pairs of N-channel MOSFETs which are disposed in correspondence with the complementary data lines $\underline{D}O$–$\underline{D}7$ of the memory array ARYO. The mating sets of the P-channel MOSFETs and N-channel MOSFETs constituting the Y switch circuit YSO are respectively coupled in common on one side, and then coupled to the corresponding ones of the non-inverted and inverted signal lines of the complementary data lines $\underline{D}O$–$\underline{D}7$. In addition, the other sides of the P-channel MOSFETs are coupled in common to the non-inverted or inverted signal lines of reading complementary common data lines $\underline{C}DRO$, while the other sides of the N-channel MOSFETs are coupled in common to the non-inverted or inverted signal lines of writing complementary common data lines $\underline{C}DWO$. The gates of the respective pairs of P-channel MOSFETs are coupled in common, and are supplied with the corresponding ones of inverted data line select signals YOB–Y7B from the Y address decoder YD. Likewise, the gates of the respective pairs of N-channel MOSFETs are coupled in common and are supplied with the inverted signals of the corresponding ones of the inverted data line select signals YOB–Y7B as produced by CMOS inverter circuits, that is, with non-inverted data line select signals YO–Y7.

The respective pairs of P-channel MOSFETs and N-channel MOSFETs constituting the Y switch circuit YSO are selectively and simultaneously brought into "on" states in such a way that the corresponding ones of the inverted data line select signals YO–Y7 are alternatively set at the low level. As a result, the complementary data lines of the memory array ARYO in one corresponding set are connected to the sense amplifier SAO through the reading complementary common data lines CDRO and are also connected to the write amplifier WAO through the writing complementary common data lines CDWO.

The sense amplifier SAO preferably includes a differential circuit including a pair of transistors. The bases of these transistors are respectively coupled to the non-inverted and inverted signal lines of the reading complementary common data lines CDRO through predetermined level shift circuits. The emitters of these transistors are coupled in common to the ground potential of the circuitry through a regulated current source which is selectively brought into an operating state in accordance with an inverted timing signal $\phi maO_B$. The collectors of the transistors constituting the differential circuit are coupled to complementary read signal lines RDO, and are further coupled to the corresponding read amplifier RAO. The complementary read signal lines RDO are coupled in common to the output terminals of the corresponding sense amplifier SAO of the pairing memory mat periphery circuit MPC01.

The sense amplifier SAO further comprises pulling-up P-channel MOSFETs which are respectively disposed between the non-inverted and inverted signal lines of the reading complementary common data lines CDRO and the ground potential of the circuitry. A precharge circuit which is disposed between the non-inverted and inverted signal lines and is selectively brought into an "on" state in accordance with a timing signal $\phi wrO$.

Owing to these facts, read signals transmitted from the selected memory cell MC of the memory array ARYO and through the corresponding ones of the complementary data lines DO–D7 and the reading complementary common data lines CDRO are converted into corresponding current signals at the collectors of the transistors constituting the differential circuit of the sense amplifier SAO, that is, at the complementary read signal lines RDO, and the current signals are further transmitted to the read amplifier RAO. On this occasion, the sense amplifier SAO is selectively brought into an operating state in accordance with a timing signal $\phi maO$, namely, the mat select signal. In this manner, the write amplifier WAO of either of the pairing memory mats MPCOO and MPC01 is alternatively brought into an operating state.

The write amplifier WAO comprises a pair of 2-input NAND gate circuits including CMOS transistors. The input terminals of these NAND gate circuits on one side are supplied in common with a corresponding timing signal $\phi weO$ from the Y address decoder YD, while the other input terminals thereof are respectively supplied with the corresponding inverted write signal WDOB and non-inverted write signal WDO from the data input buffer DIB. The output terminals of the NAND gate circuits are respectively coupled to the non-inverted and inverted signal lines of the writing complementary common data lines CDWO.

Owing to these facts, the complementary write signals WDO transmitted through the data input buffer DIB are written into the selected memory cell MC of the memory array ARYO through the Writing complementary common data lines CDWO from the write amplifier WAO. On this occasion, the write amplifier WAO is selectively brought into an operating state in accordance with a timing signal $\phi meO$, namely, the mat select signal. In this manner, the write amplifiers WAO of the pairing memory mats MPCOO and MPC01 are alternatively brought into operating states.

Aligners

Figure 16:
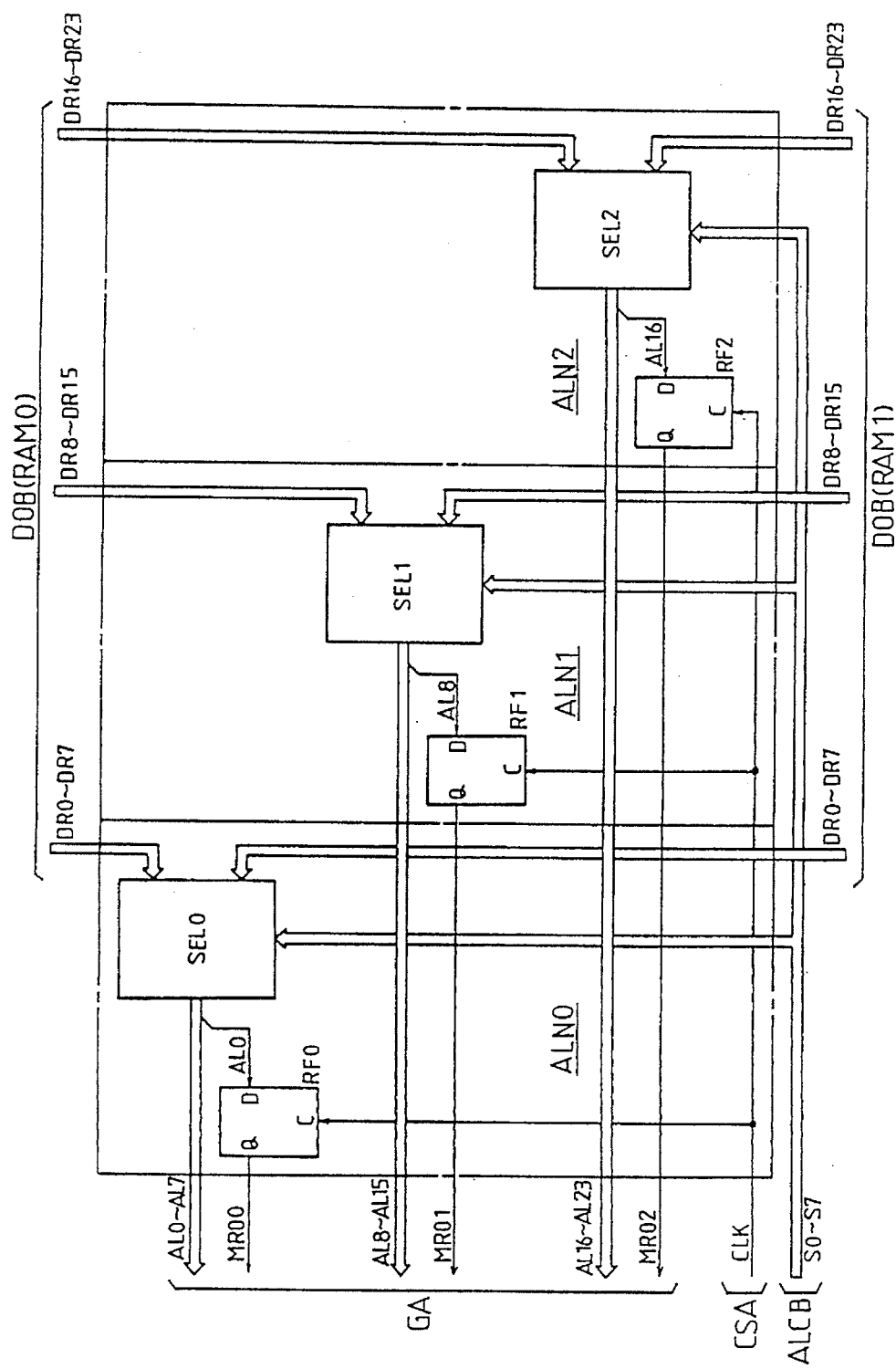
FIG. 16 is a block diagram of aligners of the RAM macrocell of FIG. 12.

With reference now to FIG. 16, a block diagram of an embodiment of the aligners (sequence control circuits) ALNO, ALN2 of the RAM macrocell (RAMO) in FIG. 3 is shown. In addition, FIG. 17 shows a circuit diagram of an embodiment of a selector circuit SELO constituting the aligner ALNO in FIG. 16. The other aligners ALN1 and ALN2 has the same circuit arrangement as that of the aligner ALNO in FIG. 17. The aligners ALNO–ALN2 are shared by the two RAM macrocells RAMO and RAM1 forming the pair.

Referring to FIG. 16, the aligner ALNO includes the selector circuit SELO, and a diagnosing latch circuit RFO which receives one of the output signals of this selector circuit. Likewise, the aligner AL1 includes a selector circuit SEL1 and a diagnosing latch circuit RF1 which receives one of the output signals of this selector circuit, while the aligner AL2 includes a selector circuit SEL2 and a diagnosing latch circuit RF2 which receives one of the output signals of this selector circuit. The selector circuits SELO–SEL2 of the aligners are respectively supplied with the corresponding 8-bit read signals DRO–DR7 through DR16–DR23 from the data output buffer DOB and are similarly supplied with the corresponding 8-bit read signals DRO–DR7 through DR16–DR23 from the data output buffer DOB of the pairing RAM macrocell (RAM1). All the selector circuits are further supplied with the 8-bit select signals SO–S7 from the aligner control signal buffer ALCB. One bit of a combination consisting of the select signals SO–S3 and one bit of a combination consisting of the select signals S4–S7 are alternately set at the high level, respectively.

As typically shown by the selector circuit SELO in FIG. 17, each of the selector circuits SELO–SEL2 comprises 16 unit selector circuits USEL which receive the read signals DRO–DR7 delivered from the two pairing RAM macrocells and the select signals SO S3 in a predetermined combination, and 8 unit selector circuits USEL which receive the output signals of the 16 unit selector circuits and the select signals S4–S7 in a predetermined combination.

Each of the 24 unit selector circuits constituting each selector circuit includes, as exemplified in the left lower part of FIG. 17, four 2-input NAND gate circuits of CMOS type and a 4-input NAND gate circuit of bipolar-CMOS type which receives the inverted output signals of the 2-input NAND gate circuits. The input terminals on one side, of the 2-input NAND gate circuits of the respective unit selector circuits are supplied with the read signals DRO–DR7 or the output signals of the unit selector circuits USEL at the preceding stages in a predetermined sequence, while the input terminals thereof on the other side are supplied with the select signals SO–S3 and S4–S7 in a predetermined sequence. Thus, the read signals DRO–DR7 through DR16–DR23 supplied from the two pairing RAM macrocells are afforded to the output terminals ALO–AL7 through AL16–AL23 of the selector circuits SELO–SEL2 in combinations each consisting of 8 bits and in predetermined sequences conforming to the select signals S0–S7. These output signals are further combined in predetermined sequences in a buffer storage or the like which is constructed using a plurality of similar memories with logic functions. In this manner, the large-scale aligner of, for example, a computer is constructed. Besides, the substantial address space of the memory with logic functions is expanded by the selecting operation of such an aligner, and various memory devices having comparatively large storage capacities is efficiently constructed.

In this manner, the aligners ALN0–ALN2 are arranged at the peripheries of the RAM macrocells and in the extending direction of the complementary data lines of the memory arrays and are constructed as the dedicated logic circuits, whereby the number of the spanning wiring lines to be laid between the RAM macrocells and the gate array portion GA can be curtailed to about half, and the transmission paths of the output signals can be shortened to reduce the skews between the bits thereof. As a result, the layout of the memory with logic functions can be rendered efficient, and the operation thereof is stabilized and made faster.

Meanwhile, when note is taken of the first-bit output signal AL0 of the selector circuit SEL0, the read signals DR0–DR7 delivered from the two pairing RAM macrocells are alternatively output according to the select signals S0–S7. That is, the read signals DR0–DR7 through DR16–DR23 of the two pairing RAM macrocells are sequentially scanned out in the combinations each consisting of 8 bits as the first-bit output signals AL0, AL8 and AL16 of the respective selector circuits SEL0–SEL2 in such a way that the select signals S0–S3 and S4–S7 are sequentially set at logic "1" or the high level. When the memory with logic functions is operated in the predetermined diagnosis mode, these output signals are accepted into the corresponding diagnostic latch circuits RF0–RF2 and are thereafter sent as the scan-out signals MR00–MR02 in accordance with the clock signal CLK. In this manner, the diagnostic processing of the RAM macrocells are efficiently executed in the memory with logic functions or in the computer system or the like which includes the buffer storage including the memory with logic functions.

Clock Group Circuit

In the illustrated embodiment, the eight RAM macrocells (RAM0–RAM7) and the gate array GA0–GA5 are synchronously operated according to complementary clock signals $\overline{CP1}$–$\overline{CP6}$ in six phases. A clock group circuit includes two clock shaping circuits CSP0 and CSP1, one clock distribution circuit CDA and ten clock switch amplifiers CSA0–CSA9. The clock group circuit forms predetermined internal clock signals on the basis of the complementary clock signals $\overline{CP0}$–$\overline{CP6}$ and distributes them to the various portions.

Block Arrangement of Clock Group Circuit

Figure 18:
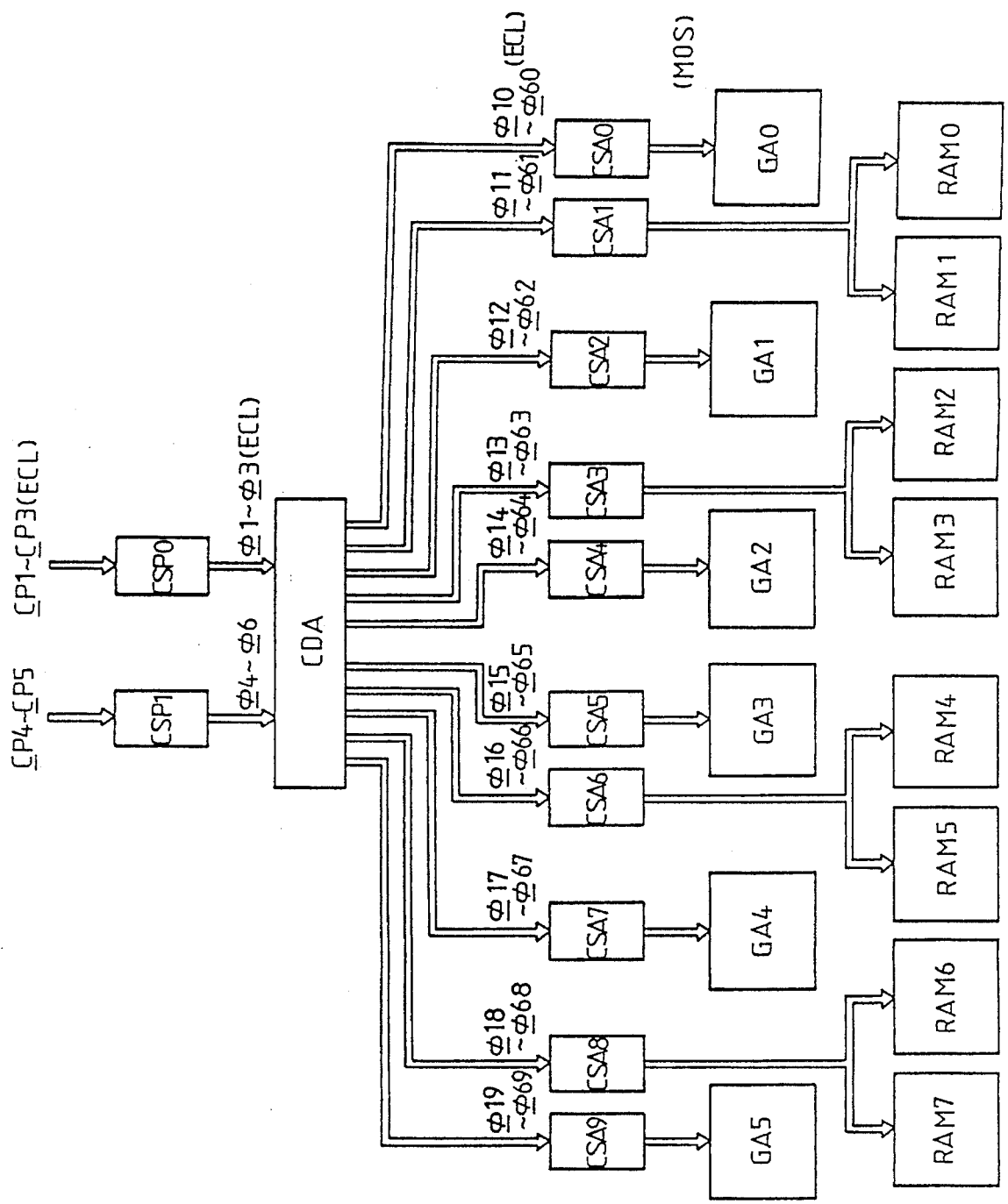
FIG. 18 is a block diagram of the clock group circuit of the memory of FIG. 1.

With reference now to FIG. 18, a block diagram of an embodiment of the clock group circuit which is included in the memory with logic functions in FIG. 1 is shown.

Referring to FIG. 18, the complementary clock signals $\overline{CP1}$–$\overline{CP3}$ of three phases among the complementary clock signals of six phases to be fed to the memory with logic functions are supplied to the clock shaping circuit CSP0. The remaining complementary clock signals $\overline{CP4}$–$\overline{CP6}$ of three phases are supplied to the clock shaping circuit CSP1. These complementary clock signals have their rises and signal amplitudes adjusted by the corresponding clock shaping circuits CSP0 and CSP1, and are thereafter supplied to the clock distribution circuit CDA as complementary internal clock signals $\phi1$–$\phi3$ and $\phi4$–$\phi6$.

The clock distribution circuit CDA branches the complementary internal clock signals $\phi1$–$\phi6$ ten times, into complementary internal clock signals $\phi10$–$\phi19$ through $\phi60$–$\phi69$, which are supplied to the corresponding clock switch amplifiers CSA0–CSA9.

The clock switch amplifiers CSA0–CSA9 form distribution clock signals of MOS levels on the basis of the corresponding complementary internal clock signals $\phi10$–$\phi60$ through $\phi19$–$\phi69$. Those of the distribution clock signals which are formed by the six clock switch amplifiers CSA0, CSA2, CSA4, CSA5, CSA7 and CSA9 are respectively supplied to the proximate gate array parts GA0, GA1, GA2, GA3, GA4 and GA5, and those which are formed by the clock switch amplifiers CSA1, CSA3, CSA6 and CSA8 are respectively supplied to the two proximate RAM macrocells RAM0 and RAM1, RAM2 and RAM3, RAM4 and RAM5, and RAM6 and RAM7.

In this embodiment, the complementary clock signals $\overline{CP0}$–$\overline{CP5}$ are supplied to the memory with logic functions in terms of the ECL levels and are transmitted to the clock switch amplifiers CSA0 CSA9 as the ECL levels left intact. Then, the transmitted signals are converted into the MOS levels by the respective clock switch amplifiers, that is, at the receiving ends of the corresponding RAM macrocells or gate array parts. Therefore, the clock shaping circuits CSP0, CSP1 and clock distribution circuit CDA constituting the clock group circuit and the preceding-stage circuits of the clock switch amplifiers CSA0–CSA9 constituting the same are constructed using ECL circuits basically configured of bipolar transistors, are described below.

Layout of Clock Group Circuit

Figure 19:
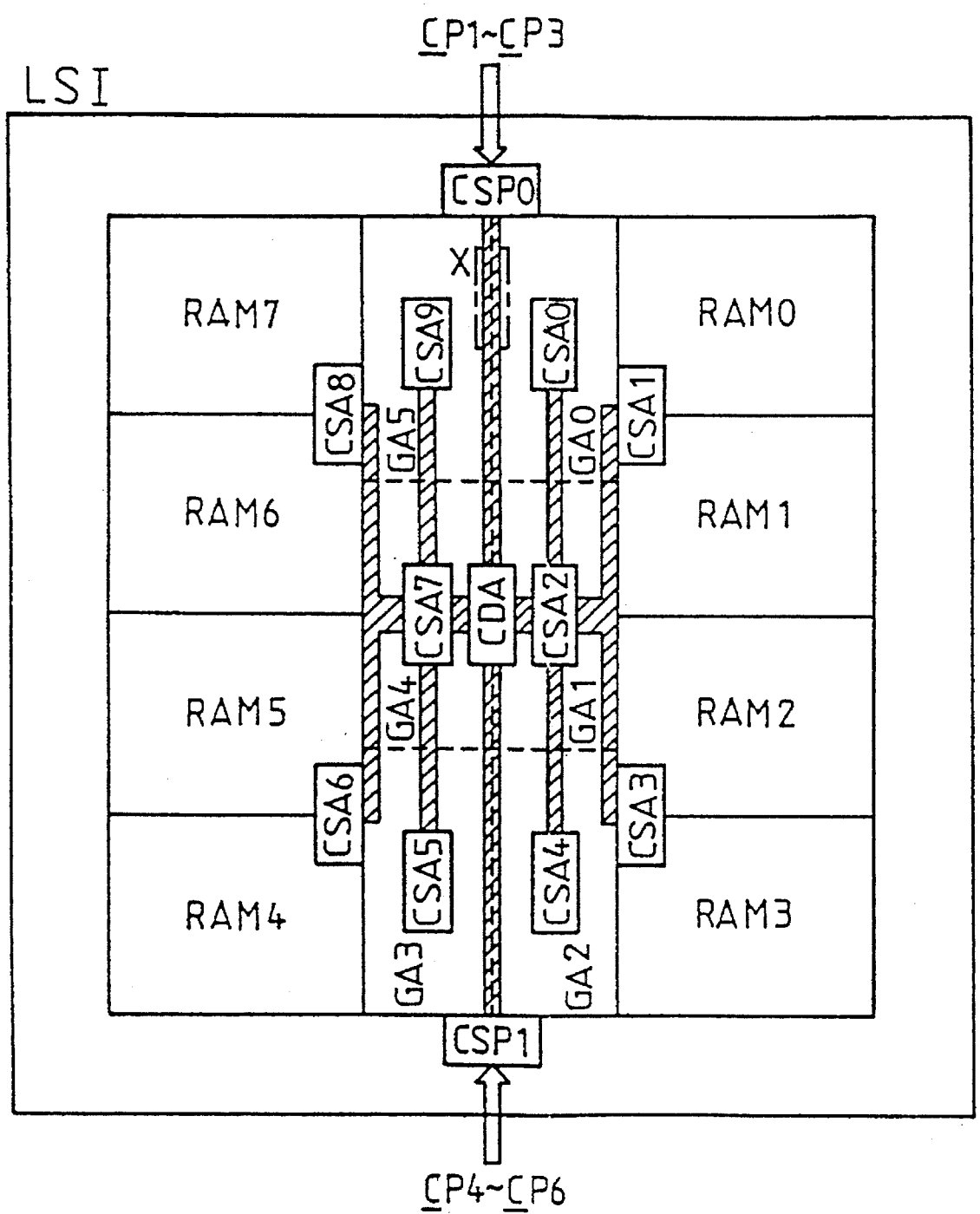
FIG. 19 is an arrangement diagram of the clock group circuit of FIG. 18.
Figure 20:
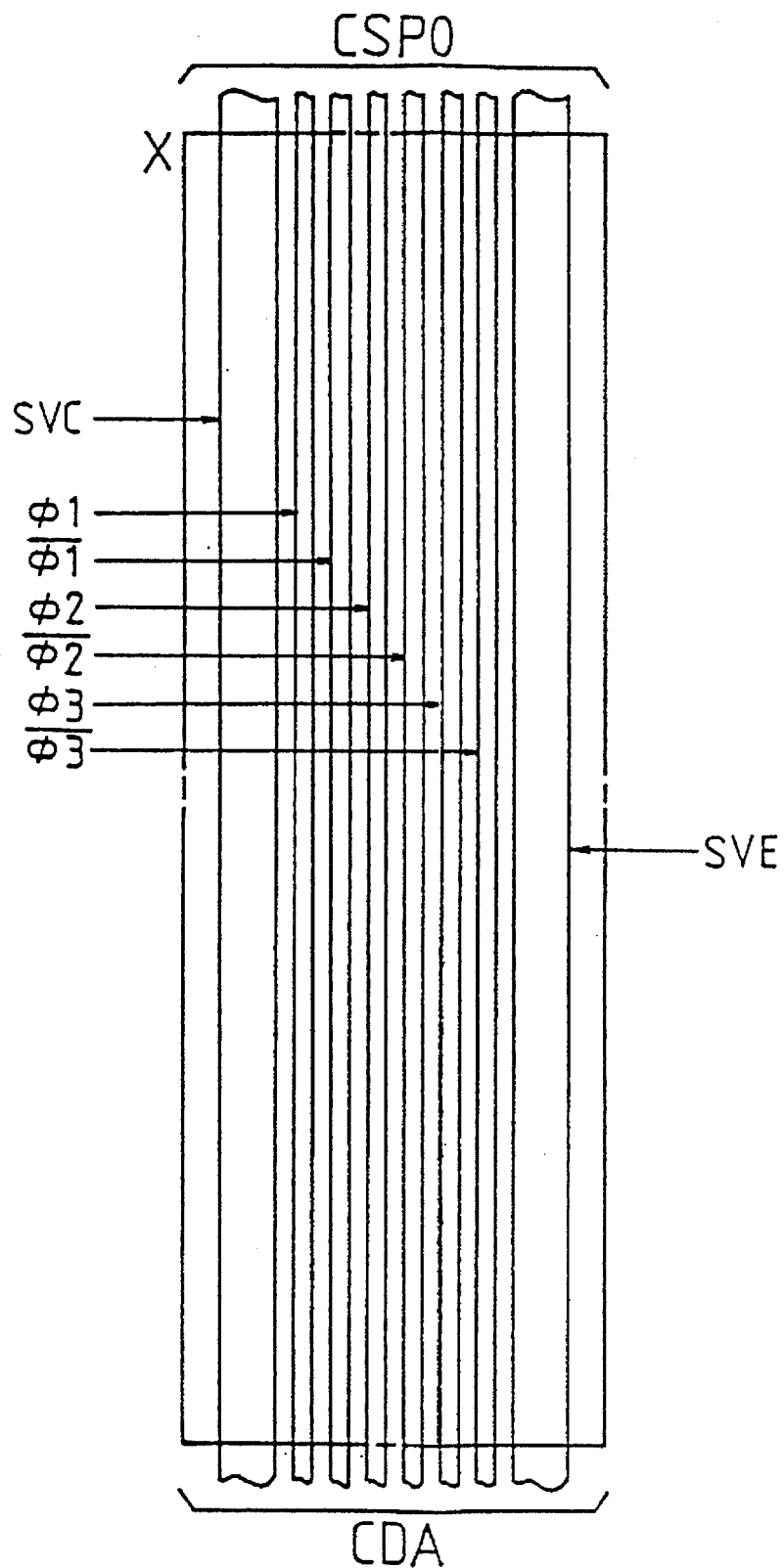
FIG. 20 is a partial enlarged arrangement diagram of the clock group circuit in FIG. 18.

Referring to FIG. 19, a substrate arrangement diagram of an embodiment centering round the clock group circuit of the memory with logic functions (LSI) in this example is shown. FIG. 20 shows an enlarged arrangement diagram of an embodiment of that wiring region X within a dedicated wiring region in FIG. 19 which is enclosed with a dot-and-dash line.

Referring to FIG. 19, the clock shaping circuits CSP0 and CSP1 constituting the clock group circuit are respectively arranged centrally of the upper latus and lower latus of the semiconductor substrate. The clock distribution circuit CDA is arranged at the central part of the semiconductor substrate. The six clock switch amplifiers CSA0, CSA2, CSA4, CSA5 CSA7 and CSA9 are respectively arranged substantially at the central parts of the corresponding gate array parts GA0–GA5, while the remaining four clock switch amplifiers CSA1, CSA3, CSA6 and CSA8 are respectively arranged at the central parts of the receiving end sides of the corresponding two RAM macrocells.

In this embodiment, the clock shaping circuits CSP0, CSP1, clock distribution circuit CDA and clock switch amplifiers CSA0–CSA9 constituting the clock group circuit are formed by employing dedicated buried regions without using standard cells which are included in the gate array parts GA0–GA5. Besides, as stated above, the clock distribution circuit CDA is arranged substantially centrally of the plane of the semiconductor substrate and at substantially equal distances from the clock shaping circuits CSP0 and CSP1. Further, as indicated by hatching in FIG. 19, clock signal lines for transmitting the complementary internal clock signals from the clock shaping circuits CSP0 and CSP1 to the clock distribution circuit CDA and from the clock distribution circuit CDA to the clock switch amplifiers CSA0–CSA9 are formed in the dedicated wiring region without using channel regions for general wiring. Thus, the dispersions of the transfer characteristics of the clock shaping circuits, the clock distribution circuit, etc. attendant upon the changes of manufacturing processes and environments are suppressed, and the dispersions of the lengths of the clock signal lines are suppressed. As a result, the interphase skews of the complementary internal clock signals are curtailed, and the operation of the memory with logic functions is stabilized.

In this embodiment, the internal clock signals are transmitted at the ECL levels. Most of the other internal signals are transmitted as the MOS levels. Therefore, in case of closely laying the signal lines to which the internal clock signals of the ECL levels are transmitted and the signal lines to which the internal signals of the MOS levels are transmitted, noise tends to be induced on the side of the internal clock signals of the ECL levels due to the level changes of the internal signals of the MOS levels. In order to prevent this noise from reducing stability of the LSI memory, shielded wiring lines including a ground potential feed line SVC and a supply voltage feed line SVE are laid on both the sides of that part of the dedicated wiring region in which the complementary internal clock signals $\phi1$–$\phi3$ are transmitted, in the embodiment of FIG. 20. Thus, the noise to be induced in the signal lines to which the internal clock signals etc. of the ECL levels are transmitted, from the signal lines to which the internal signals of the MOS levels are transmitted, can be diminished to stabilize the operation of the memory with logic functions.

Clock Shaping Circuit

Figure 21:
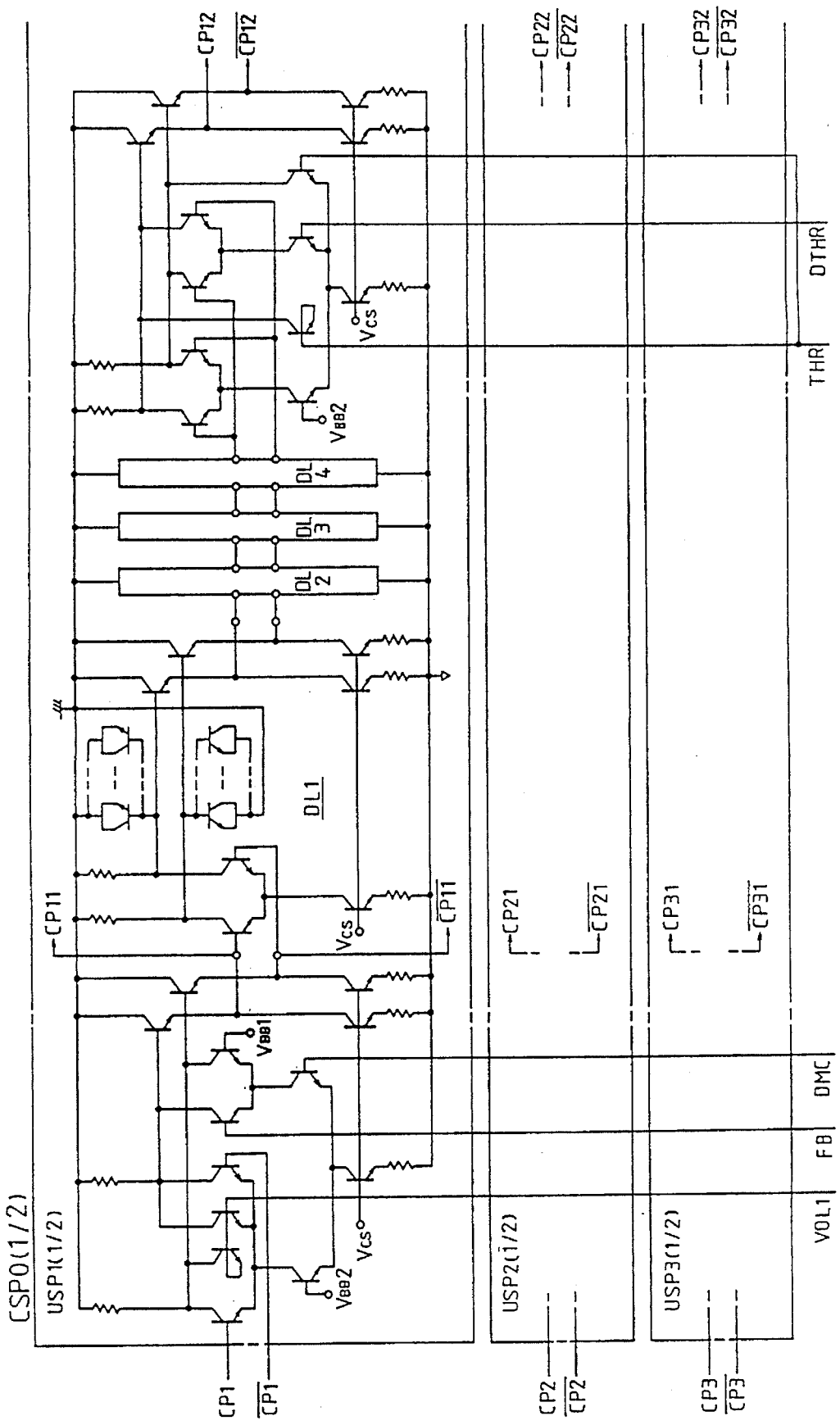
FIGS. 21 and 22 are circuit diagrams of a clock shaping circuit of the clock group circuit of FIG. 18.
Figure 22:
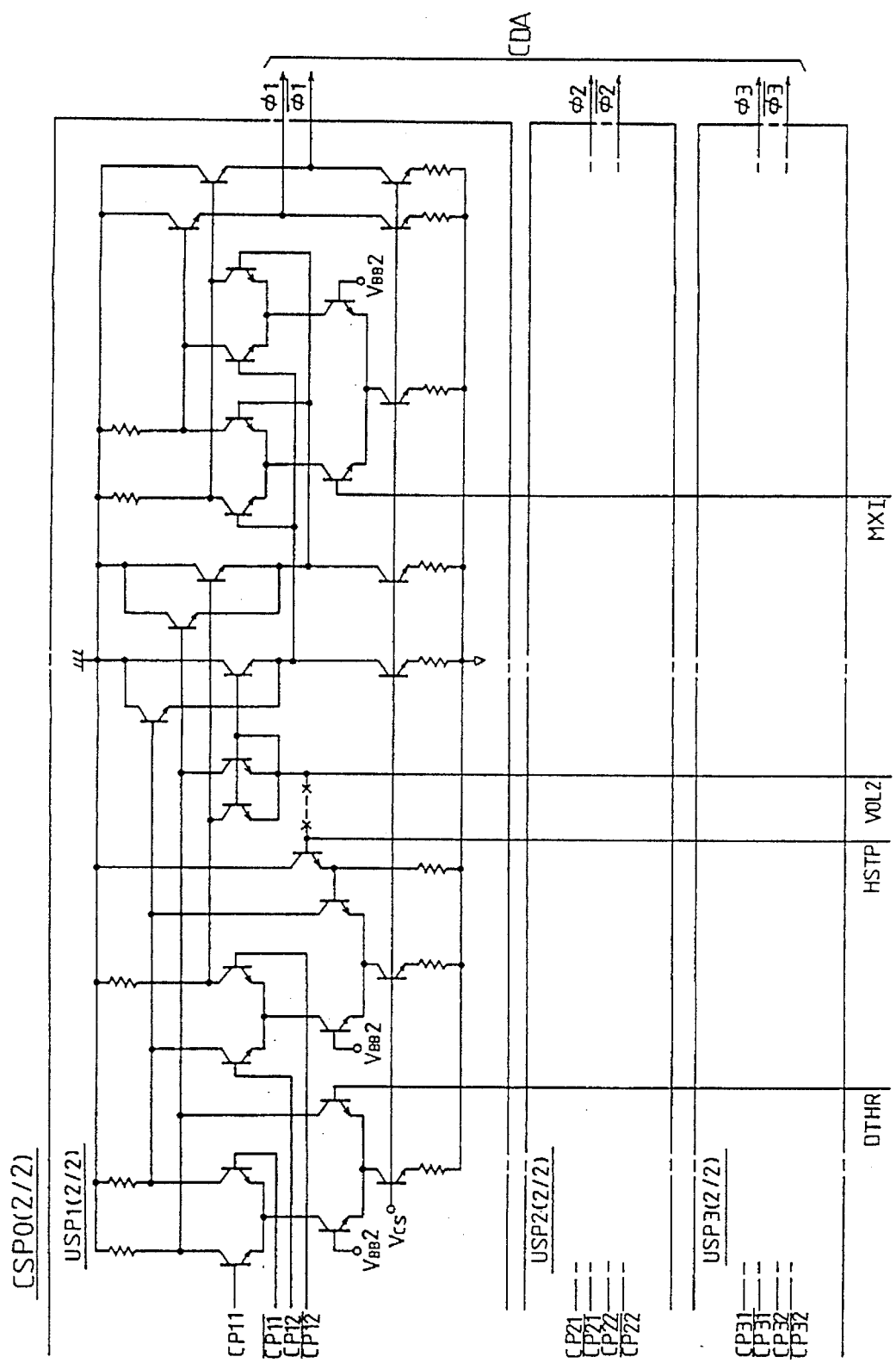

FIGS. 21 and 22 show circuit diagrams of an embodiment of the clock shaping circuit CSP0 of the clock group circuit in FIG. 18. The other clock shaping circuit CSP1 is endowed with the same circuit arrangement as that of the clock shaping circuit CSP0.

Referring to FIGS. 21 and 22, each of the clock shaping circuits CSP0 and CSP1 includes three unit shaping circuits USP1–USP3 which are disposed in correspondence with the complementary clock signals CP1–CP3 or CP4–CP6, as typically shown by the clock shaping circuit CSP0. As typically shown by the unit shaping circuit USP1, each of these unit shaping circuits is basically configured of ECL differential circuits, and it further comprises four delay circuits DL1 DL4, pulse synthesizing circuits, etc.

The clock shaping circuits CSP0 and CSP1 adjust the rise (setup) times and pulse widths of the complementary clock signals CP1–CP3 and CP4–CP6 supplied in terms of the ECL levels, thereby to form the predetermined complementary internal clock signals $\phi1$–$\phi3$ and $\phi4$–$\phi6$, respectively. As stated above, these complementary clock signals are transmitted to the clock distribution circuit CDA arranged at the central part of the semiconductor substrate, through the corresponding clock signal lines laid in the dedicated wiring region.

Clock Distribution Circuit

Figure 23:
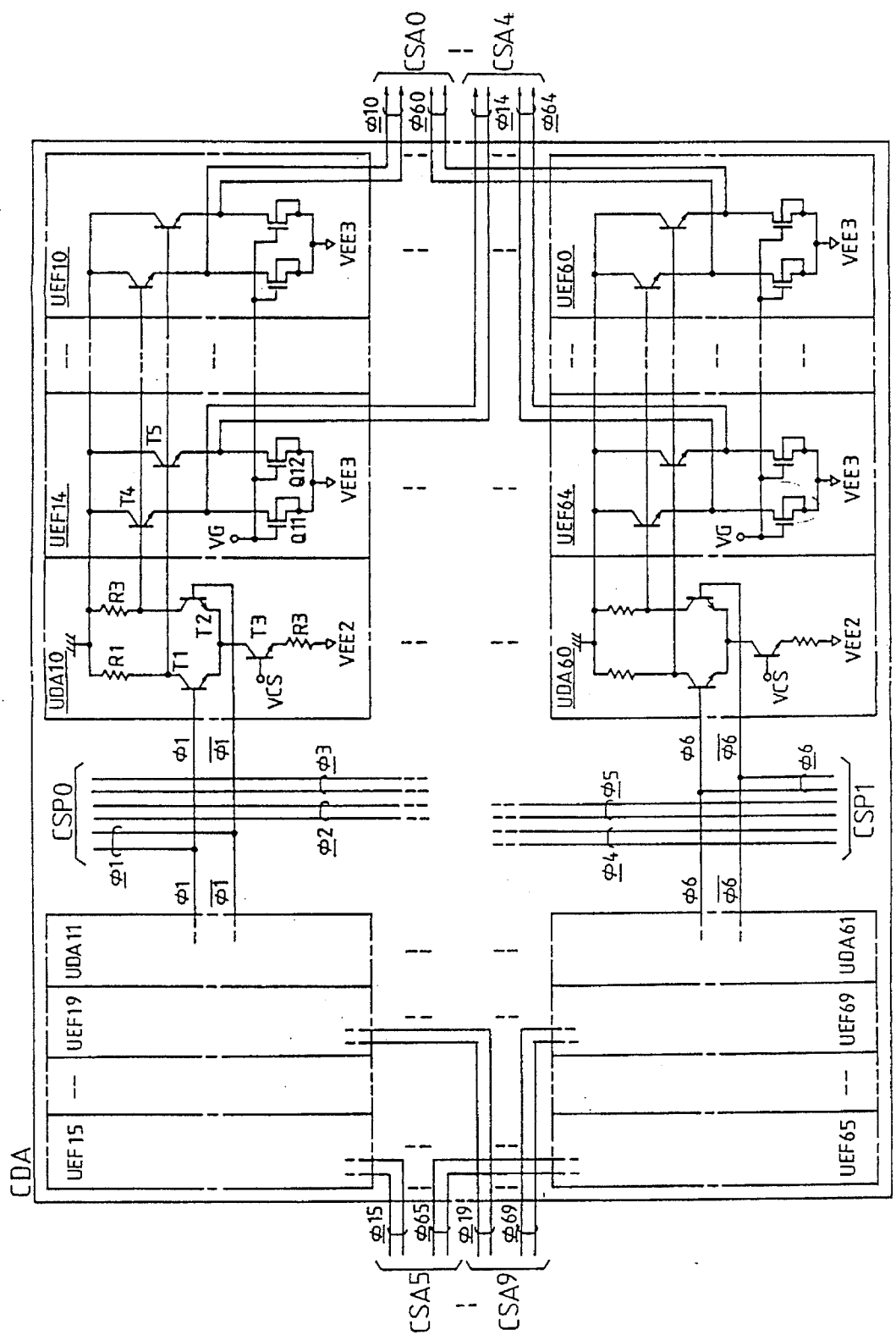
FIG. 23 is a circuit diagram of a clock distribution circuit of the clock group circuit of FIG. 18.

FIG. 23 shows a circuit diagram of an embodiment of the clock distribution circuit CDA which is included in the clock group circuit in FIG. 18.

Referring to FIG. 23, the clock distribution circuit CDA includes unit distribution circuits UDA10, UDA11 thru UDA60, UDA61 totaling 12, every two of which are disposed in correspondence with each of the phases of the complementary internal clock signals $\phi1$–$\phi6$ fed from the clock shaping circuits CSP0, CSP1, and unit output circuits UEF10–UEF19 thru UEF60–UEF69 totaling 60, every ten of which are disposed in correspondence with each of the phases of the complementary internal clock signals $\phi1$– $\phi6$. Each of the unit distribution circuits UDA10, UDA11 thru UDA60, UDA61 among the above constituents includes an ECL differential circuit which is basically configured of a pair of differential transistors T1 and T2, as exemplified in FIG. 23. Besides, each of the unit output circuits UEF10–UEF19 thru UEF60–UEF69 includes a pair of output emitter follower circuits, each of which is configured of a transistor T4 and an N-channel MOSFET Q11, or a transistor T5 and an N-channel MOSFET Q12.

The clock distribution circuit CDA branches each of the complementary internal clock signals $\phi1$–$\phi6$ ten times, thereby to form the complementary internal clock signals $\phi10$–$\phi19$ thru $\phi60$–$\phi69$. As stated before, these complementary internal clock signals are respectively transmitted to the corresponding clock switch amplifiers CSA0–CSA9 through the corresponding clock signal lines which are laid in the dedicated wiring region.

Meanwhile, in each of the various parts of the memory with logic functions in this embodiment, an ECL differential circuit or current switch circuit including a pair of differential transistors, just as the unit distribution circuit mentioned above, coexists with a bipolar-CMOS hybrid circuit including bipolar transistors and MOSFETs, just as the unit output circuit mentioned above. As is well known, an output emitter follower circuit has its operating current changed comparatively greatly in accordance with the logic levels of the corresponding output signal thereof. On the other hand, the ECL differential circuit or current switch circuit undergoes slight changes in its operating current and is also endowed with a high sensitivity. Accordingly, in a case where these circuits are fed with a supply voltage through a supply voltage feed wiring line which is common thereto, the current switch circuit of the high sensitivity malfunctions due to power source noise, and the operation of the memory with logic functions becomes unstable.

In order to cope with this drawback, a supply voltage feed point VEE2 (first supply voltage feed point) for the current switch circuit is provided separately from a supply voltage feed point VEE3 (second supply voltage feed point) for the bipolar-CMOS hybrid circuit. Thus, the fluctuation of the supply voltage of the current switch circuit attendant upon the change of the operating current of the bipolar-CMOS hybrid circuit is suppressed, and the operation of the memory with logic functions is stabilized.

Meanwhile, it has heretofore been common that a substrate potential pulling-up power source line for feeding the supply voltage to the back gates of the N-channel MOSFETs Q11 and Q12, etc., in otherwords, to the semiconductor substrate is coupled to the supply voltage feed point VEE2 of little voltage fluctuation. With this method, however, it is apprehended that the MOSFETs Q11 and Q12, etc. will be brought into reverse-biased states by, for example, the voltage fluctuation of the supply voltage feed point VEE3, to incur latch-up. In order to cope with this drawback, according to the memory with logic functions in this embodiment, the substrate potential pulling-up power source line of these MOSFETs is coupled to the supply voltage feed point VEE3, thereby to prevent the MOSFETs Q11 and Q12, etc. from falling into the reverse-biased states. As a result, the latch-up of the MOSFETs can be prevented to enhance the reliability of the memory with logic functions.

Clock Switch Amplifier

Figure 24:
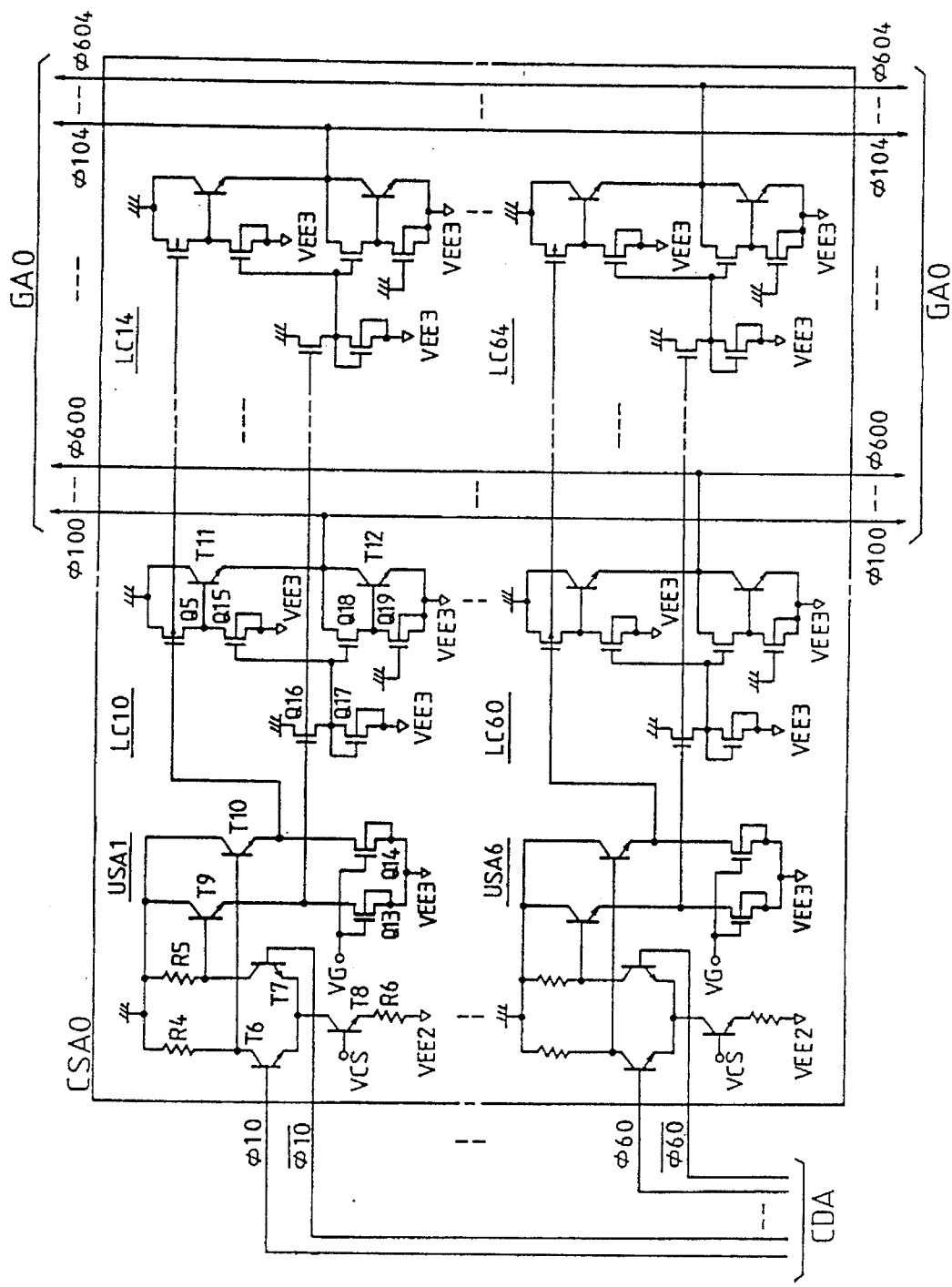
FIG. 24 is a circuit diagram of a clock switch amplifier of the clock group circuit in FIG. 18.

FIG. 24 shows a circuit diagram of an embodiment of the clock switch amplifier CSA0 of the clock group circuit in FIG. 18. Each of the other clock switch amplifiers CSA1–CSA9 is endowed with the same circuit arrangement as that of the clock switch amplifier CSA0.

Referring to FIG. 24, each of the clock switch amplifiers CSAO–CSA9 includes as typically shown by the clock switch amplifier CSAO, six unit switch amplifiers USA1–USA6 which are disposed in correspondence with the respective phases of the complementary internal clock signals, for example, φ10–φ60, and level conversion circuits LC10–LC14 through LC60–LC64 totaling 30, every five of which are disposed in correspondence with each of the unit switch amplifiers.

Each of the unit switch amplifiers USA1–USA6 of the above constituents includes an ECL differential circuit which is basically configured of a pair of differential transistors T6 and T7 and the complementary input terminals of which are respectively supplied with the corresponding ones of the complementary internal clock signals φ10–φ60, as typically shown by the unit switch amplifier USA1 or USA6. Each of the level conversion circuits LC10–LC14 thru LC60–LC64 is implemented as a bipolar-CMOS hybrid circuit which is endowed with the same circuit arrangement as that of the succeeding-stage circuit of the input circuit cell ICO depicted in FIG. 15 and which comprises a CMOS circuit including a P-channel MOSFET Q5 and N-channel MOSFETs Q15–Q19, and a pair of output transistors T11 and T12, as typically shown by the level conversion circuit LC10 in FIG. 24. The complementary input terminals of these level conversion circuits are supplied with the complementary output signals of the corresponding unit switch amplifiers USA1–USA6 in common.

The clock switch amplifiers CSAO–CSA9 form distribution clock signals φ100–φ104 thru φ600–φ604 of MOS levels on the basis of the corresponding complementary internal clock signals φ10–φ60 thru φ19–φ69, and supply them to the corresponding gate array parts GAO–GA5 or the corresponding pairs of RAM macrocells.

Meanwhile, likewise to the clock distribution circuit CDA stated above, the clock switch amplifiers CSAO–CSA9 include the ECL differential circuits or current switch circuits which have high sensitivities, and the bipolar-CMOS hybrid circuits whose operating currents fluctuate comparatively greatly. Also in these clock switch amplifiers, therefore, a supply voltage feed point VEE2 for the current switch circuits and a supply voltage feed point VEE3 for the bipolar-CMOS hybrid circuits are separately provided, and the back gates of the N-channel MOSFETs Q13–Q19, namely, the substrate potential pulling-up power source line is .coupled to the supply voltage feed point VEE3. Thus, the operation of the memory with logic functions is stabilized, and the latch-up of the MOSFETs is prevented.

As indicated in the above embodiments, when this invention is applied to a semiconductor integrated circuit device such as a memory with logic functions constituting the buffer storage of a computer or the like, the following functional effects are achieved:

(1) In an LSI memory or the like having a gate array portion and a plurality of RAM macrocells, aligners etc. for selectively transmitting the output signals of the RAM macrocells are implemented as dedicated logic circuits. They are arranged near the peripheries of the RAM macrocells and extend in the direction of data lines. The numbers of spanning wiring lines laid between the gate array portion and the RAM macrocells is reduced. The transmission paths of the output signals are shorter.

(2) In the above item (1), input buffers such as an address buffer and an input data buffer are arranged near the peripheries of the RAM macrocells and extend in the direction of word lines. The transmission paths of input signals for the RAM macrocells are shorter.

(3) Owing to the above items (1) and (2), there are brought forth the effects that the layout design of the spanning wiring lines between the gate array portion and the RAM macrocells is more efficient. Skewing between the bits of the output signals and the input signals is diminished to stabilize the operation of the memory with logic functions and to raise its operating speed.

(4) The internal circuit of each of the gate array portion etc. of the memory with logic functions or the like is divided into a plurality of blocks. Preselected power source smoothing capacitors are arranged near the peripheries of these blocks to suppress the fluctuation of a supply voltage attendant upon the changes of the operating currents of the gate array portion.

(5) In the above item (4), the power source smoothing capacitor includes a plurality of unit capacitor cells each of which is formed having the same area as that of each unit gate array cell of the gate array portion. This enables the unit capacitor cells to be arranged at any desired positions or be additionally disposed by standardizing them. The coupling between the electrode of each unit capacitor cell and supply voltage feed wiring or ground potential feed wiring is efficiently processed.

(6) Owing to the above items (4) and (5), the power source smoothing capacitors are formed in a layer under the supply voltage feed wiring and the ground potential feed wiring. This enables the plane of a semiconductor substrate to be effectively utilized.

(7) Input circuit cells and output circuit cells constituting the input/output portions of the memory with logic functions or the like are closely arranged in respective predetermined numbers. They are used singly or In selective combinations, to realize any desired input circuit or output circuit conforming to a signal form or a driving capability. The serviceability of the input circuit cells and output circuit cells is improved.

(8) In an LSI memory, a predetermined shielded wiring line formed of a supply voltage feed wiring line, a ground potential feed-wiring line or the like is laid between a signal line to which an internal signal is transmitted in terms of ECL levels left intact and a signal line to which an internal signal is transmitted in terms of MOS levels. This suppresses any noise induced in the internal signal of the ECL levels due to the change of the internal signal of the MOS levels.

(9) Owing to the above item (8), the operation of the LSI memory is stabilized.

(10) In a RAM macrocell or the like having a memory array which includes a plurality of complementary data lines, and a Y switch circuit by which the complementary data lines are selectively connected to a sense amplifier etc.; a pull-up circuit for affording predetermined bias voltages to the complementary data lines is arranged between the memory array and the Y switch. This speeds the pull-up operation of each of the complementary data lines, hence the operation of the RAM macrocell.

(11) In a memory with logic functions or the like having a plurality of RAM macrocells which are dispersively arranged on a semiconductor substrate, a clock distribution circuit which transmits clock signals to the RAM macrocells is arranged substantially centrally of the plurality of RAM macrocells. This reduces the interphase skews of the clock signals to stabilize the operation of the LSI memory.

(12) A wiring line replacement region having a predetermined width is formed between RAM macrocells the signal wiring lines of which are chiefly laid out by hand labor and a gate array portion the signal wiring lines of which are chiefly laid out automatically by a computer. This enables the layout of spanning wiring lines between the RAM macrocells and the gate arrays to be efficiently designed.

(13) A first supply voltage feed point which feeds a supply voltage to a current switch circuit of comparatively high sensitivity is provided separately from a second supply voltage feed point which feeds the supply voltage to a bipolar-CMOS hybrid circuit with its operating current changing comparatively greatly. This suppresses the supply voltage fluctuation of the current switch circuit side attendant upon the change of the operating current of the bipolar-CMOS hybrid circuit to prevent the malfunction of the current switch circuit.

(14) In the above item (13), a substrate potential pulling-up power source line which is disposed near the N-channel MOSFETs of the bipolar-CMOS hybrid circuit is coupled to the second supply voltage feed point, thereby to prevent the N-channel MOSFETs from falling into reverse-biased states, preventing the latch-up thereof.

Although, the above invention has been concretely described in conjunction with embodiments, it is needless to say that this invention is not restricted to the foregoing embodiments, but that it can be variously altered within a scope not departing from the purport thereof. By way of example, in FIG. 1, the arrangement of the various blocks constituting the RAM macrocells is not restricted by this embodiment. In FIGS. 2 thru 4, the numbers of the input circuit cells and output circuit cells constituting the input/output circuit cell unit IOCU are at will, and the combinations thereof are also at will. In addition, the input circuit cells and output circuit cells need not especially assume the unitary form as the input/output circuit cell unit IOCU. The bonding pads PAD may well be arranged at, for example, the central part of the semiconductor substrate SUB. Various aspects of performance will be thought out as the practicable arrangements of the input circuit cells ICO shown in FIGS. 5 and 6 and the output circuit cells OCO shown in FIGS. 7 and 8. In FIGS. 9 and 10, the unit capacitor cell CC may well be formed having an area equivalent to, for example, a plurality of unit gate array Cells, and the method of dividing the gate array portion GA into blocks for providing the power source smoothing capacitors is at will. The internal circuit which is divided into a plurality of blocks and in which the power source smoothing capacitors are provided near the respective blocks, is not restricted to the gate array portion only. In FIG. 11, the device structure of the unit capacitor cell CC can employ various aspects of performance. In FIG. 12, the number of the RAM macrocells to be disposed in the memory with logic functions is at will, and the storage capacity of the memory or the number of divisions of the gate array portion GA is also at will. Moreover, the layouts of the RAM macrocells, gate array portion GA, input/output circuit cell portion I/O, and clock shaping circuits CSPO and CSP1 are mere examples, and various aspects of performance will be thought out. The RAM macrocells may well be replaced with different sorts of memory macrocells, for example, ROMs (read only memories). In FIG. 13, the aligners ALNO–ALN2 need not be especially brought into the RAM macrocells as parts thereof. Besides, the number of divisions of the memory mat, the assortment of the various buffers, and the combinations of the address signals, control signals etc. can employ various aspects of performance. In FIG. 14, the numbers of memory arrays constituting the memory mats MAT00 and MAT01, etc. are at will, and the arrangements thereof are also at will. Moreover, the layout of the various portions constituting the mat periphery circuits MPCOO and MPC01 is at will, subject to the condition that the pull-up circuits PUO–PU7 are arranged between the memory arrays and Y switch circuits corresponding thereto. In FIG. 15, the memory arrays ARYO etc. can comprise redundant word lines and redundant complementary data lines for remedying defects, and they may well be basically constructed of memory cells of any type other than the high resistance load type. Besides, the practicable circuit arrangements of the various portions of the memory-array and memory-mat integrated circuits MPCOO etc. are not restricted by this embodiment. In FIGS. 16 and 17, the aligners ALNO–ALN2 need not especially include the diagnosing flip-flop circuits RFO–RF2, and an algorithm for selecting the output signals is not restricted. In FIGS. 18 and 19, the installation numbers, combinations and layouts of the various portions constituting the clock group circuit are not restricted by this embodiment. Moreover, the number of phases of the clock signals to be fed to the memory with logic functions is at will, and the number of phases of the clock signals to be used in each portion is also at will. The practicable circuit arrangements of the clock shaping circuit CSPO, clock distribution circuit CDA, clock switch amplifier CSAO, etc. illustrated in FIGS. 21 thru 24 are not restricted by this embodiment.

The present invention has been principally described as to the case of the application to the memory with logic functions to constitute the buffer storage of a computer or the like forming the background field of utilization. However, this invention is not restricted thereto, but it is also applicable to, for example, a memory with logic functions to be used as a single unit, various integrated logic circuit devices each including similar RAM macrocells and gate array portion, and various arithmetic processors each including a memory with logic functions. This invention is extensively applicable to semiconductor integrated circuit devices each having, at least, RAM macrocells and a gate array portion.

Effects which are attained by typical ones of inventions disclosed in the present application will be briefly explained below. In a semiconductor integrated circuit device such as a memory with logic functions having a plurality of RAM macrocells and a gate array portion:

(1) sequence control circuits for selectively transmitting the output signals of the RAM macrocells are arranged as dedicated logic circuits near the peripheries of the RAM macrocells, whereby the numbers of spanning wiring lines to be laid between the RAM macrocells and the gate array portion can be curtailed, and the transmission paths of the output signals can be shortened. As a result, the layout design of the memory with logic functions or the like can be rendered efficient, and the operation thereof can be stabilized and raised in speed.

(2) Unit gate array cells constituting the gate array portion are arranged in the form in which each is divided into a plurality of blocks, and power source smoothing capacitors each including a plurality of unit capacitor cells, each of which is formed having substantially the same area as that of the unit gate array cell, are disposed near the peripheries of the gate array cells, whereby the fluctuation of a supply voltage in the gate array portion can be suppressed to stabilize the operation of this portion.

(3) Input circuit cells and output circuit cells for transmitting the input signals and output signals of the memory with logic functions or the like, respectively, are arranged so as to adjoin in proximity every predetermined number, and they are used singly or selectively in combination. Besides, a shielded wiring line of supply voltage feed wiring or ground potential feed wiring is laid between a clock signal line to which a clock signal of ECL levels is transmitted and another signal line to which an internal signal of MOS levels is transmitted, and a clock distribution circuit is arranged substantially centrally of the plurality of RAM macrocells. Thus, the mutual interference between the signal to be transmitted in terms of the ECL levels and the signal to be transmitted in terms of the MOS levels can be suppressed, and the skew between bits can be suppressed, whereby the operation of the memory with logic functions or the like can be stabilized.

(4) A wiring line replacement region of predetermined width is interposed between the RAM macrocells whose signal wiring lines are chiefly laid out by hand labor and the gate array portion whose signal wiring lines are chiefly laid out by a computer, whereby the spanning wiring lines between the RAM macrocells and the gate array portion and the start points and end points thereof can be replaced at will, to efficiently design the layout thereof.

(5) A first supply voltage feed point for current switch circuits of comparatively high sensitivity is provided separately from a second supply voltage feed point for other bipolar-CMOS hybrid circuits, and a substrate potential pulling-up power source line which is laid near N-channel MOSFETs constituting the bipolar-CMOS hybrid circuits is coupled to the second supply voltage feed point, whereby the fluctuation of the supply voltage of the current switch circuits attendant upon the changes of the operating currents of the bipolar-CMOS hybrid circuits can be suppressed to stabilize the operation of the memory with logic functions.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A semiconductor integrated circuit device having a semiconductor substrate, said device comprising:

a plurality of memory blocks arranged on said semiconductor substrate, each memory block including a memory mat and a peripheral circuit; and a plurality of logic blocks formed on said substrate, each logic block including:

a plurality of unit gate array cells which (i) are coupled to clock signal lines to receive internal clock signals therefrom, (ii) are coupled to supply voltage feed lines to receive a supply voltage therefrom, and (iii) are coupled to ground potential feed lines to receive a ground potential therefrom, and a plurality of unit capacitor cells, each of which is substantially the same size as that of said each unit gate array cell, each of said unit capacitor cells being coupled to said supply voltage feed lines and said ground potential feed lines, each of said unit capacitor cells being contiguous to a corresponding at least one of said unit gate array cells.

2. The semiconductor integrated circuit device according to claim 1 at least one of said unit capacitor cells is formed under at least one of said clock signal lines.

3. The semiconductor integrated circuit device according to claim 1 wherein said logic blocks and said plurality of memory blocks operate at MOS levels and are mounted on a common substrate, and further including:

an input circuit cell unit including a plurality of input circuit cells, each input circuit cell including an ECL-MOS level conversion circuit which converts an ECL level input signal into a MOS level internal signal, said plurality of logic blocks and said plurality of memory blocks being connected with said input circuit cell unit to receive said MOS level internal signal therefrom;

an output circuit unit including a plurality of output circuit cells, each output circuit cell being connected with said plurality of logic blocks and said plurality of memory blocks to receive said MOS level internal signal therefrom and including a MOS-ECL level conversion circuit which converts said MOS level internal signal into an ECL output signal.

4. The semiconductor integrated circuit device according to claim 1 further including:

a first clock signal line for transmitting a first level clock signal from a first input circuit to said plurality of logic blocks and said plurality of memory blocks;

a second clock signal line transmitting a second level clock signal from a second input circuit to said plurality of logic blocks and said plurality of memory blocks; and a shielded wiring line disposed between said first and second clock signal lines.

5. The semiconductor integrated circuit device according to claim 1 wherein each of said plurality of memory blocks includes:

a memory array which has a plurality of data lines;

a y-switch circuit by which said data lines are selectively connected to a sense amplifier; and a pull-up circuit which is disposed in correspondence with said data lines and which pull-up circuit is arranged between said memory array and said y-switch.

6. The semiconductor integrated circuit device according to claim 1 wherein said plurality of memory blocks are dispersively arranged on the semiconductor substrate, each of said plurality of memory blocks includes a memory mat and a peripheral circuit, each of said plurality of memory blocks being the same distance from a corresponding clock signal distribution circuit.

7. The semiconductor integrated circuit device according to claim 3 wherein said plurality of memory blocks are dispersively arranged on a semiconductor substrate, each of said plurality of memory blocks include a memory mat and a peripheral circuit, and further including a distribution circuit arranged substantially centrally of said plurality of memory blocks for relaying and distributing said ECL output signal thereamong.

8. The semiconductor integrated circuit device according to claim 1 wherein each of said unit capacitor cell is a MOS capacitor.

9. The semiconductor integrated circuit device according to claim 8 wherein said MOS capacitor includes a well region formed on said substrate, and polycrystalline silicon layer formed over said well region and silicon oxide film formed between said well region and said polycrystalline silicon layer.

10. The semiconductor integrated circuit device according to claim 9 wherein:

said polycrystalline silicon layer is coupled to at least one of said ground potential feed lines; and said well region is coupled to at least one of said supply voltage feed lines.

11. The semiconductor integrated circuit device according to claim 10 wherein:

said well region is N-type; and, said substrate is P-type.

12. A semiconductor integrated circuit device having a semiconductor substrate, said device comprising:

a plurality of unit gate array cells;

a plurality of supply voltage feed lines for supplying a supply voltage;

a plurality of ground potential feed lines for supplying a ground potential;

a plurality of unit capacitor cells, said plurality of unit gate array cells and said plurality of unit capacitor cells being arranged in a checkered pattern and having substantially the same size as each other, said plurality of unit gate array cells (i) being coupled to said plurality of supply voltage feed lines such that said plurality of unit gate array cells receive said supply voltage therefrom, and (ii) being coupled to said plurality of ground potential feed lines such that said plurality of unit gate array cells receive said ground potential therefrom; and each of said plurality of unit capacitor cells consisting of a single capacitor which is coupled to at least one of said plurality of supply voltage feed lines and said plurality of ground potential feed lines, such that a fluctuation of a voltage of at least one of said plurality of supply voltage feed lines and said plurality of ground potential feed lines is lessened.

13. A semiconductor integrated circuit device having a semiconductor substrate, said device comprising:

(1) a plurality of unit gate array cells;

(2) a plurality of unit capacitor cells, said plurality of unit gate array cells and said plurality of unit capacitor cells being arranged in a checkered pattern and having substantially the same size as each other;

(3) a plurality of supply voltage feed lines for supplying a supply voltage;

(4) a plurality of ground potential feed lines for supplying a ground potential; and (5) a plurality of memory blocks arranged on said semiconductor substrate, each of said plurality of memory blocks including a memory mat and a peripheral circuit;

said plurality of unit gate array cells (i) being coupled to said plurality of supply voltage feed lines such that each said unit gate array cell receives said supply voltage therefrom, and (ii) being coupled to said plurality of ground potential feed lines such that each of said unit gate array cell receives said ground potential therefrom, and each of said unit capacitor cells being coupled to at least one of said plurality of supply voltage feed lines and said plurality of ground potential feed lines.

14. The semiconductor integrated circuit device according to claim 12 wherein each of said plurality of supply voltage feed lines and said plurality of ground potential feed lines extends to a predetermined direction, and each of said plurality of unit capacitor cells and said plurality of unit gate array cells is formed in a space between corresponding lines of said plurality of supply voltage feed lines and said plurality of ground potential feed lines.

15. A semiconductor integrated circuit device according to claim 12 wherein each of said plurality of gate array cells are formed with common element construction.

16. The semiconductor integrated circuit device according to claim 12 wherein each of said unit capacitor cell is a MOS capacitor.

17. The semiconductor integrated circuit device according to claim 16 wherein said MOS capacitor includes a well region formed on said substrate, and polycrystalline silicon layer formed over said well region and silicon oxide film formed between said well region and said polycrystalline silicon layer.

18. The semiconductor integrated circuit device according to claim 17 wherein:

said polycrystalline silicon layer is coupled to at least one of said ground potential feed lines; and said well region is coupled to at least one of said supply voltage feed lines.

19. The semiconductor integrated circuit device according to claim 18 wherein said well region is N-type and said substrate is P-type.

20. A semiconductor integrated circuit device comprising:

a first line for providing a first voltage, said first line extending in a predetermined direction;

a second line for providing a second voltage, said second line extending in said predetermined direction;

a unit capacitor cell coupled to at least one of said first line and said second line so that a fluctuation of a voltage of at least one of said first line and said second line can be lessened, said unit capacitor cell consisting of one capacitor;

a plurality of unit gate array cells, said unit capacitor cell and said plurality of unit gate array cells being substantially the same size as each other; and a plurality of memory blocks arranged on said semiconductor substrate, each of said plurality of memory blocks including a memory mat and a peripheral circuit.

21. A semiconductor integrated circuit device comprising:

a first line for providing a first voltage, said first line extending in a predetermined direction;

a second line for providing a second voltage, said second line extending in said predetermined direction;

a unit capacitor cell coupled to at least one of said first line and said second line such that fluctuations of a voltage of at least one of said first line and said second line are lessened, said unit capacitor cell consisting of one capacitor; and a plurality of unit gate array cells, said unit capacitor cell and said plurality of unit gate array cells being substantially the same size as each other.

22. The semiconductor integrated circuit device according to claim 21 said plurality of unit gate array cells are formed with a common element construction.

23. The semiconductor integrated circuit device according to claim 21 wherein said capacitor is a MOS capacitor.

24. The semiconductor integrated circuit device according to claim 23 wherein said MOS capacitor includes a well region formed on said substrate, and polycrystalline silicon layer formed over said well region and silicon oxide film formed between said well region and said polycrystalline silicon layer.

25. The semiconductor integrated circuit device according to claim 21, further comprising:

a third line for providing a third voltage, said third line extending in said predetermined direction and being arranged between said first line and said second line, and wherein said first and said second voltages are a supply voltage, and said third voltage is a ground potential, said unit capacitor is coupled to said third line and to at least one of said first line and said second line, and each of said plurality of unit gate array cells is coupled to said third line and to at least one of said first line and said second line.

26. The semiconductor integrated circuit device according to claim 24 wherein said well region is N-type and said substrate is P-type.

27. The semiconductor integrated circuit device according to claim 25, wherein said plurality of unit gate array cells are formed with a common element construction.

28. The semiconductor integrated circuit device according to claim 21, further comprising:

a third line adapted to provide a third voltage, said third line extending in said predetermined direction and being arranged between said first line and said second line, and wherein each of said first voltage and said second voltage is a first voltage level, said third voltage is a second voltage level which is different from said first voltage level, said unit capacitor is coupled to said third line and to at least one of said first line and said second line, and each of said plurality of unit gate array cells is coupled to said third line and to at least one of said first line and said second line.

29. A semiconductor integrated circuit device having a semiconductor substrate, said device comprising:

a plurality of first voltage supply lines extending in a predetermined direction;

a plurality of first unit cells; and a plurality of second unit cells each consisting of one capacitor, each of said plurality of second unit cells having substantially the same size as each of said plurality of first unit cells, each of said plurality of second unit cells being electrically coupled to at least one of said plurality of first voltage supply lines such that any fluctuation of a voltage of said at least one of said plurality of first voltage supply lines are lessened, said plurality of first unit cells performing a predetermined logic function.

30. The semiconductor integrated circuit device according to claim 29, further comprising:

a plurality of second voltage supply lines extending in said predetermined direction, each of said plurality of second voltage supply lines being arranged between corresponding two of said plurality of first voltage supply lines, each of said plurality of second unit cells being electrically coupled to at least one of said plurality of second voltage supply lines so that any fluctuation of a voltage of said at least one of said plurality of second voltage supply lines are lessened.

31. The semiconductor integrated circuit device according to claim 30, wherein said plurality of first voltage supply lines are adapted to supply a ground potential, and said plurality of second voltage supply lines are adapted to supply a supply voltage.

32. The semiconductor integrated circuit device according to claim 30, wherein said plurality of first unit cells are formed with a common element construction.

33. The semiconductor integrated circuit device according to claim 30, wherein each of said plurality of second unit cells consists of one MOS capacitor.

34. The semiconductor integrated circuit device according to claim 33, wherein said MOS capacitor includes a well region formed on said substrate, and a polycrystalline silicon layer formed over said well region and silicon oxide film formed between said well region and said polycrystalline silicon layer.

35. The semiconductor integrated circuit device according to claim 12, wherein each of said unit capacitor cells has a pair of electrodes, one of said pair of electrodes being coupled to at least one of said supply voltage feed lines so that a fluctuation of a voltage of said at least one of said supply voltage feed lines can be lessened, and the other of said pair of electrodes being coupled to at least one of said ground potential feed lines so that a fluctuation of a voltage of said at least one of said ground potential feed lines can be lessened.

36. The semiconductor integrated circuit device according to claim 12, wherein said plurality of unit capacitor cells are formed in line.

37. The semiconductor integrated circuit device according to claim 36, wherein said plurality of unit capacitor cells are formed under a predetermined line.

38. The semiconductor integrated circuit device according to claim 37, wherein said predetermined line is a clock signal transferring line.

39. The semiconductor integrated circuit device according to claim 21, wherein said unit capacitor cell and said plurality of unit gate array cells are formed in line.

40. The semiconductor integrated circuit device according to claim 39, wherein said unit capacitor cell and said plurality of unit gate array cells are formed extending in said predetermined direction.

41. The semiconductor integrated circuit device according to claim 21, wherein said unit capacitor cell has a pair of electrodes, one of said pair of electrodes being coupled to said first line so that a fluctuation of a voltage of said first line can be lessened, and the other of said pair of electrodes being coupled to said second line so that a fluctuation of a voltage of said second line can be lessened.

42. The semiconductor integrated circuit device according to claim 41, wherein said first voltage is different from said second voltage.

43. The semiconductor integrated circuit device according to claim 42, wherein said first voltage is a supply voltage, and wherein said second voltage is a ground potential.

44. The semiconductor integrated circuit device according to claim 29, wherein said plurality of second unit cells are formed in line.

45. The semiconductor integrated circuit device according to claim 44, wherein said plurality of second unit cells are formed extending in a second direction which is perpendicular to said predetermined direction.

46. The semiconductor integrated circuit device according to claim 44, wherein said plurality of second unit cells are formed under a predetermined line.

47. A semiconductor integrated circuit device according to claim 44, wherein said plurality of first unit cells and said second unit cells are arranged in a checkered pattern.

* * * * *